United States Patent
Yamaguchi et al.

(10) Patent No.: US 11,600,578 B2
(45) Date of Patent: Mar. 7, 2023

(54) SCRIBE STRUCTURE FOR MEMORY DEVICE

(71) Applicant: Micron Technology, Inc., Boise, ID (US)

(72) Inventors: Hidenori Yamaguchi, Hiroshima (JP); Wataru Hoshino, Hiroshima (JP); Keizo Kawakita, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/237,992

(22) Filed: Apr. 22, 2021

(65) Prior Publication Data

US 2022/0344278 A1 Oct. 27, 2022

(51) Int. Cl.
*H01L 23/00* (2006.01)
*H01L 23/544* (2006.01)
*H01L 27/108* (2006.01)

(52) U.S. Cl.
CPC .......... *H01L 23/562* (2013.01); *H01L 23/544* (2013.01); *H01L 27/108* (2013.01); *H01L 2223/5446* (2013.01)

(58) Field of Classification Search
CPC ... H01L 23/562; H01L 23/544; H01L 27/108; H01L 2223/5446
See application file for complete search history.

(56) References Cited

U.S. PATENT DOCUMENTS

| | | |
|---|---|---|
| 7,417,304 B2 | 8/2008 | Tsutsue |
| 7,453,128 B2 | 11/2008 | Tsutsue et al. |
| 2002/0055256 A1 | 5/2002 | Jiang |
| 2003/0143819 A1 | 7/2003 | Hedler et al. |
| 2005/0142862 A1 | 6/2005 | Chun |
| 2009/0283311 A1 | 11/2009 | Ida |
| 2010/0059895 A1 | 3/2010 | Wakisaka |
| 2013/0113068 A1 | 5/2013 | Ramachandran et al. |
| 2013/0181329 A1 | 7/2013 | Wada |
| 2015/0235845 A1 | 8/2015 | Sekita et al. |
| 2015/0287687 A1 | 10/2015 | Farrens et al. |
| 2016/0079204 A1 | 3/2016 | Matsubara et al. |

(Continued)

OTHER PUBLICATIONS

U.S. Appl. No. 17/230,772, titled "Scribe Structure for Memory Device", filed Apr. 14, 2021.

(Continued)

*Primary Examiner* — Thanh T Nguyen
(74) *Attorney, Agent, or Firm* — Dorsey & Whitney LLP

(57) ABSTRACT

Apparatuses and methods for manufacturing chips are described. An example method includes: removing a first portion of a cover layer and at least one dielectric layer under the first portion of the cover layer in a cut region between chips to form a groove, and forming a support structure including a second portion of the cover layer and the at least one dielectric layer under the second portion of the cover layer in the cut region; removing a third portion of the cover layer in one of the chips and a portion of the at least one dielectric layer under the third portion of the cover layer to form an hole on the first chip; depositing a conductive layer to cover the cover layer and the hole; forming a conductive pillar on the conductive layer in the hole; and removing the conductive layer on the cover layer and an edge surface of the hole.

16 Claims, 27 Drawing Sheets

(56) References Cited

U.S. PATENT DOCUMENTS

| | | |
|---|---|---|
| 2016/0365340 A1 | 12/2016 | Tajima et al. |
| 2017/0256638 A1 | 9/2017 | Macelwee et al. |
| 2018/0096952 A1* | 4/2018 | Miccoli ................ H01L 23/562 |
| 2019/0035750 A1* | 1/2019 | Han ........................ H01L 22/34 |
| 2020/0312715 A1 | 10/2020 | Choi et al. |
| 2021/0391279 A1 | 12/2021 | Sugioka et al. |

OTHER PUBLICATIONS

U.S. Appl. No. 17/230,827, titled "Scribe Structure for Memory Device", filed Apr. 14, 2021.

* cited by examiner

SCRIBE STRUCTURE FOR MEMORY DEVICE

BACKGROUND

High data reliability, high speed of memory access, lower power consumption and reduced chip size are features that are demanded from semiconductor memory. In recent years, some semiconductor devices such as dynamic random-access memory (DRAM) devices include a low-k film of an insulating material, such as silicon oxycarbide (SiOC) and silicon carbonitride (SiCN), having a low dielectric constant (k) that exhibits weak electric polarization between conductive layers. The low-k film is included to reduce parasitic capacitance between the conductive layers and thus to achieve high speed operations of electronic circuits in the semiconductor devices.

However, the low-k material has weak thermo-mechanical characteristics. For example, a low-k film has lower adhesion to its adjacent conductive layer or conductive components (e.g., interconnects) compared to a silicon dioxide ($SiO_2$) film and a silicon nitride ($Si_3N_4$) film. Additionally, the low-k material is brittle. Once semiconductor elements are formed on a semiconductor wafer, the semiconductor wafer is diced into semiconductor chips. During the dicing process, cracks may be produced and such cracks may propagate through a film interface between the low-k film and another dielectric film (e.g., between $SiO_2$ and SiOC films, between $SiCN/SiO_2$ films, etc.) and reach an element formation region of the semiconductor device, which results a lower yield of the semiconductor devices.

In order to reduce the above cracks in the dicing process, a groove may be formed in a scribe region prior to dicing, by etching through layers including the low-k film. However, cut cross sections of the low-k film facing the groove tend to have a concave shape along the groove due to the brittle characteristics of the low-k material. In order to form conductive pillar bumps on wires coupled to interconnects through layers, a conductive seed layer may be formed as an initial step of electroplating of the conductive material. However, because depositing a conductive seed layer on the concave portion of the low-k film tends to fail, the conductive seed layer tends to be discontinuous from one concave portion to another, and consequently, fails to function as a seed layer.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
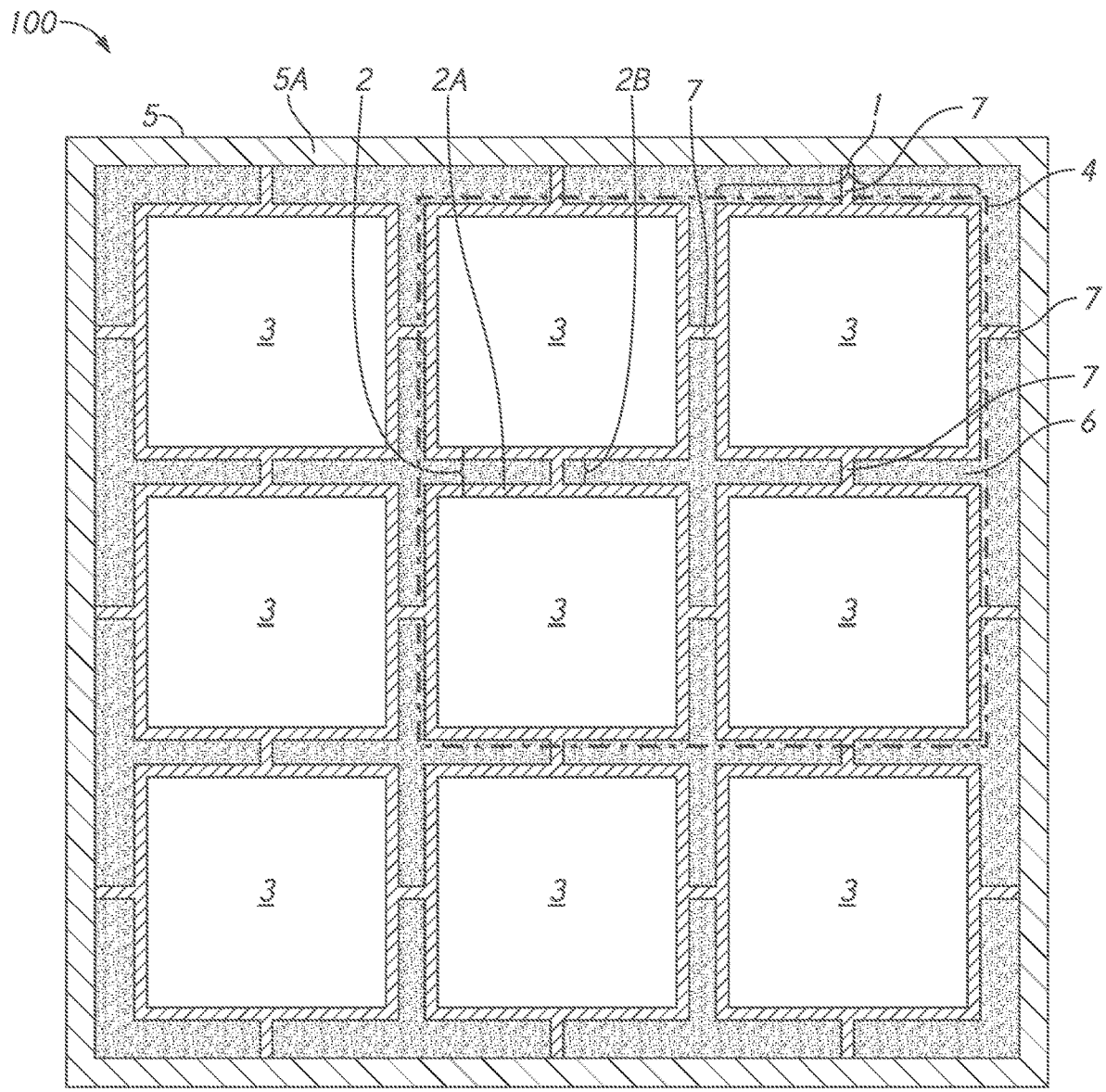
FIG. 1A is a diagram for a layout of a semiconductor device in accordance with an embodiment of the present disclosure.

FIG. 1A is a diagram for a layout of a semiconductor device 100 in accordance with an embodiment of the present disclosure. FIG. 1A is a plan view illustrating a schematic configuration of a layout of a plurality of circuit regions 3 and scribe regions 2 formed on a semiconductor device 100. In some embodiments, the semiconductor device 100 may be a semiconductor wafer. The semiconductor device 100 may include mask regions (not shown) including a mask region 5. The semiconductor device 100 may be manufactured using photo patterning by applying a mask, such as a photoresist, on each mask region 5. The semiconductor device 100 may include a margin area 5A surrounding each mask region 5.

In some embodiments, the circuit regions 3 may be disposed in a matrix and each circuit region 3 may have a rectangular shape. In each circuit region 3, transistors and circuit components, such as conductive interconnects may be disposed. For example, the transistors and the circuit components may include a plurality of memory cells, one or more circuits that provide memory access functions, such as read operations and write operations to the memory cells, and a control circuit that controls the circuits.

The semiconductor wafer 100 in FIG. 1 may be in a state before the semiconductor wafer 100 is separated into semiconductor chips 1. The scribe region 2 may be disposed around each circuit region 3. The scribe region 2 may include an edge 2A of each chip 1 surrounding each circuit region 3. In some embodiments, the edge 2A may include a test element group (not shown) including test circuits. A portion of the scribe region 2 between the edges 2A facing each other of the adjacent chips 1 may include a cut region 2B for separating the semiconductor wafer 100 into individual semiconductor chips 1. In some embodiments, some portion of the cut region 2B may be etched to become a groove 6. Some portion of the cut region 2B may include a support structure 7. The support structure 7 may be in between the edges 2A of adjacent semiconductor chips 1. The support structure 7 may have one end and another end on the edges 2A of adjacent semiconductor chips 1. Thus, the support structure 7 may physically connect the adjacent semiconductor chips 1. The support structure 7 may have a side facing the groove 6.

Figure 1B:
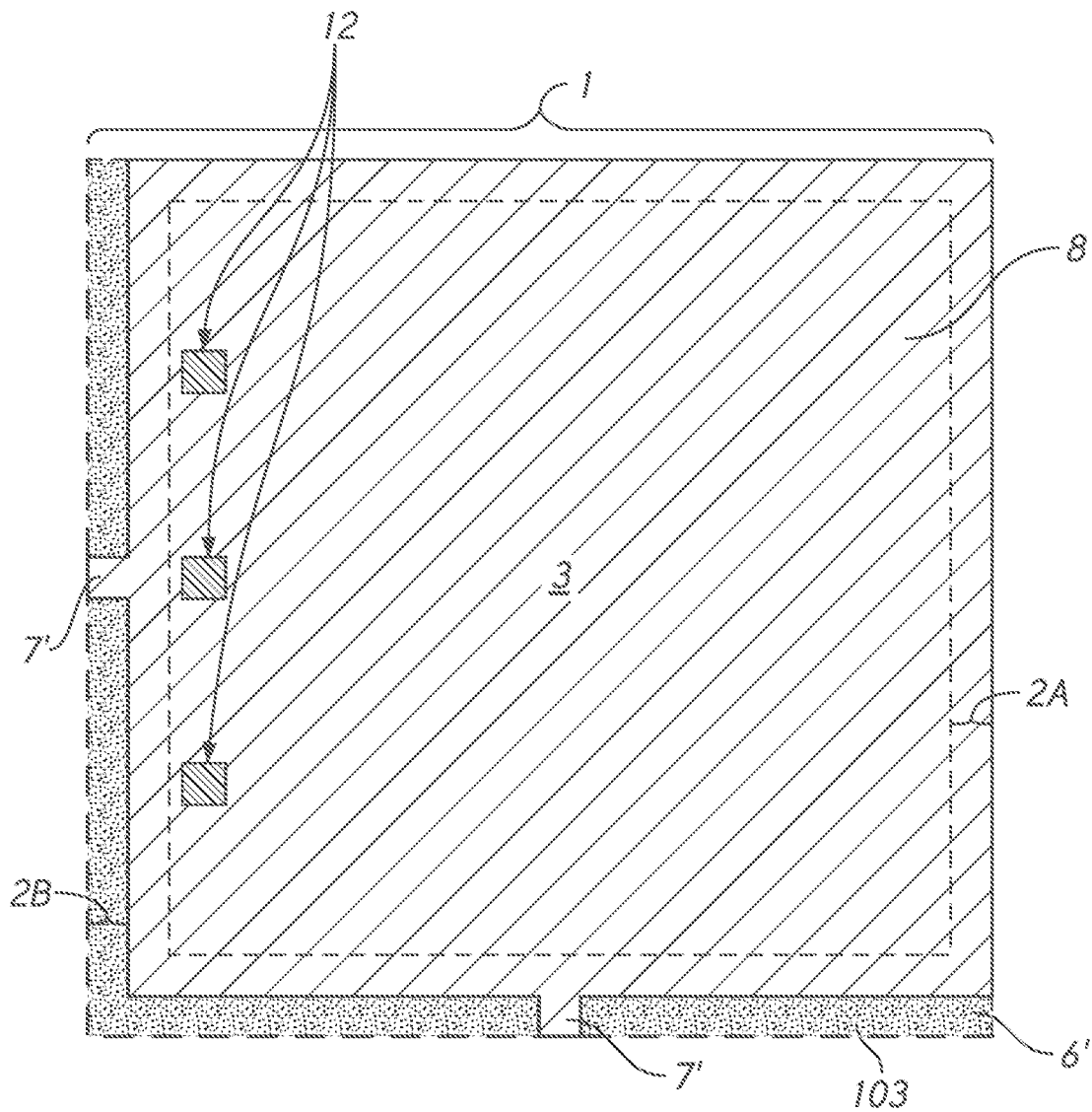
FIG. 1B is a diagram illustrating a top view of a semiconductor chip in accordance with an embodiment of the present disclosure.

FIG. 1B is a diagram illustrating a top view of the semiconductor chip 1 in accordance with an embodiment of the present disclosure. The semiconductor chip 1 may include a circuit region 3 surrounded by an edge 2A of the semiconductor chip 1. In some embodiments, separating the semiconductor wafer 100 in FIG. 1A into chips 1 may be performed by a dicing step. The dicing step may be performed along dicing lines (not shown) between edges 2A in FIG. 1A. For example, the semiconductor chip 1 may be separated by dicing lines 103 in FIG. 1B during the dicing step. After the dicing step, a residual support structure 7' of the support structure 7 having a side facing a portion 6' of the groove 6 may remain on the edge 2A of the semiconductor chip 1. The residual support structure 7' may protrude from the edge 2A, and may be connected to the edge 2A. A cover layer 8 may be disposed on the top of the semiconductor chip 1 and the support structure 7. In some embodiments, the cover layer 8 may be a dielectric film that may include silicon nitride (Si3N4) and/or silicon carbide (SiC). The cover layer 8 may include holes, and conductive pillars 12 through the cover layer 8 may be disposed in the circuit region 3. The conductive pillars 12 may be coupled to pads of the chips 1. In some embodiments, the conductive pillars 12 may include copper (Cu) or nickel (Ni).

Figure 2A:
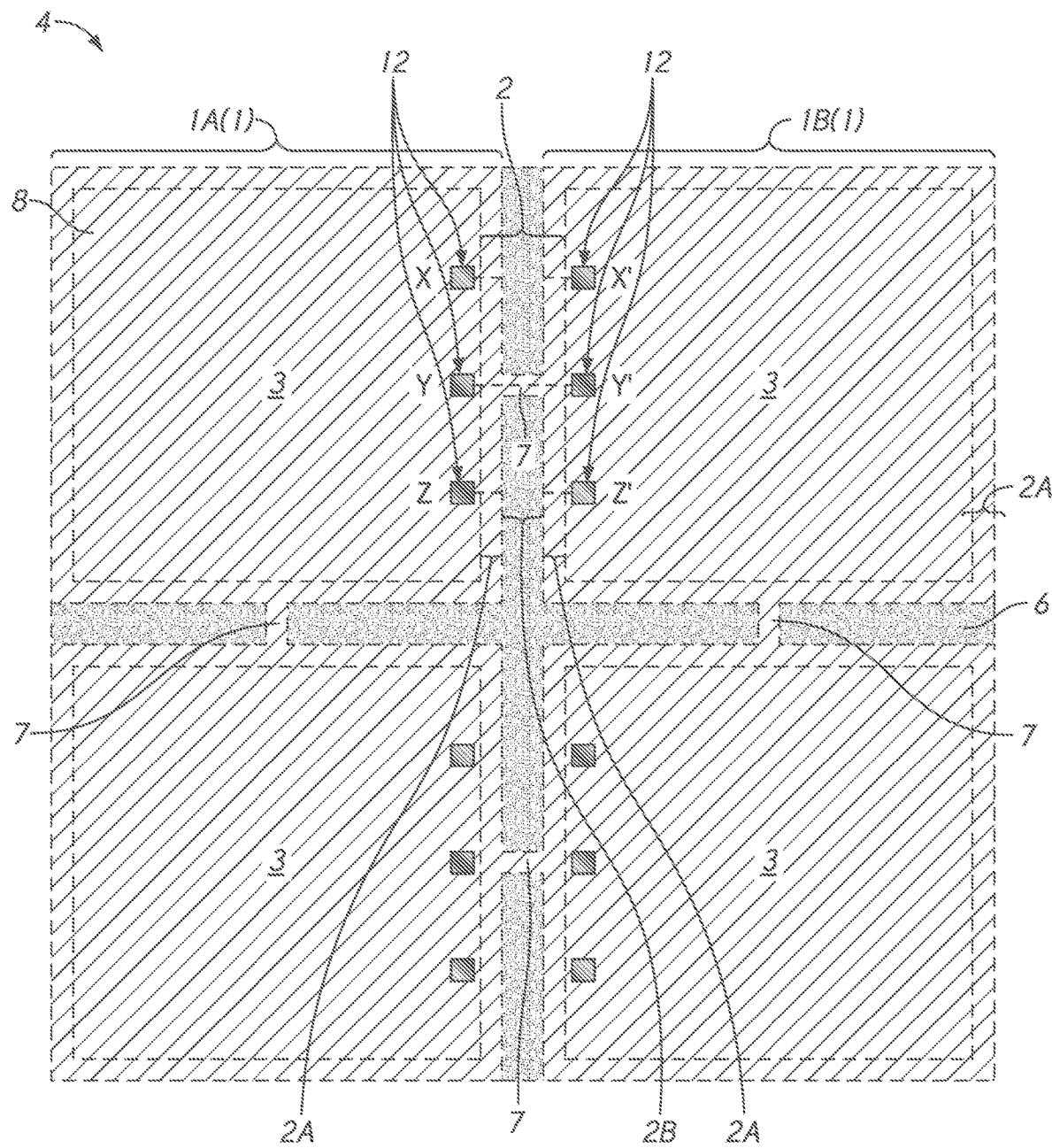
FIG. 2A is a diagram for a layout of a portion of a semiconductor device in accordance with an embodiment of the present disclosure.

FIG. 2A is a diagram for a layout of a portion 4 of the semiconductor device 100 in FIG. 1A in accordance with an embodiment of the present disclosure. In some embodiments, FIG. 2A may be a plan view of the portion 4 of the semiconductor device 100. The portion 4 of the semiconductor device 100 may be the portion 4 of the semiconductor device 100 in FIG. 1A. In some embodiments, the portion 4 may be a multilayer structure. The portion 4 may include semiconductor chips 1 including adjacent semiconductor chips 1A and 1B before separation. The semiconductor chips 1 may include circuit regions 3 surrounded by edges 2A. The portion 4 may include a scribe region 2 disposed between the circuit regions 3 of the semiconductor chips 1. The scribe region 2 may include the edges 2A of the adjacent semiconductor chips 1 facing each other. The scribe region 2 may include cut regions 2B between the edges 2A of the adjacent semiconductor chips 1. A portion of the cut regions 2B may be etched to form grooves 6. Another portion of the cut regions 2B may remain unremoved to include support structures 7 between adjacent edges 2A of adjacent semiconductor chips 1. Each support structure 7 may have one end on one edge of the adjacent edges 2A and another end on another edge of the adjacent edges 2A. Thus, each support structure 7 may physically connect adjacent semiconductor chips 1. Each support structure 7 may have a side facing the groove 6. In some embodiments, some support structure 7 may be between grooves 6. A cover layer 8 may be disposed as a top layer the semiconductor chips 1 and the support structures 7. In some embodiments, the cover layer 8 may be a dielectric film. For example, the cover layer 8 may include silicon nitride (Si3N4) and/or silicon carbide (SiC). The cover layer 8 may include holes in proximity to the edges 2A of the semiconductor chips 1, and conductive pillars 12 through the cover layer 8 may be disposed. In some embodiments, the conductive pillars 12 may include conductive material, such as copper (Cu) or nickel (Ni).

Figure 2B:
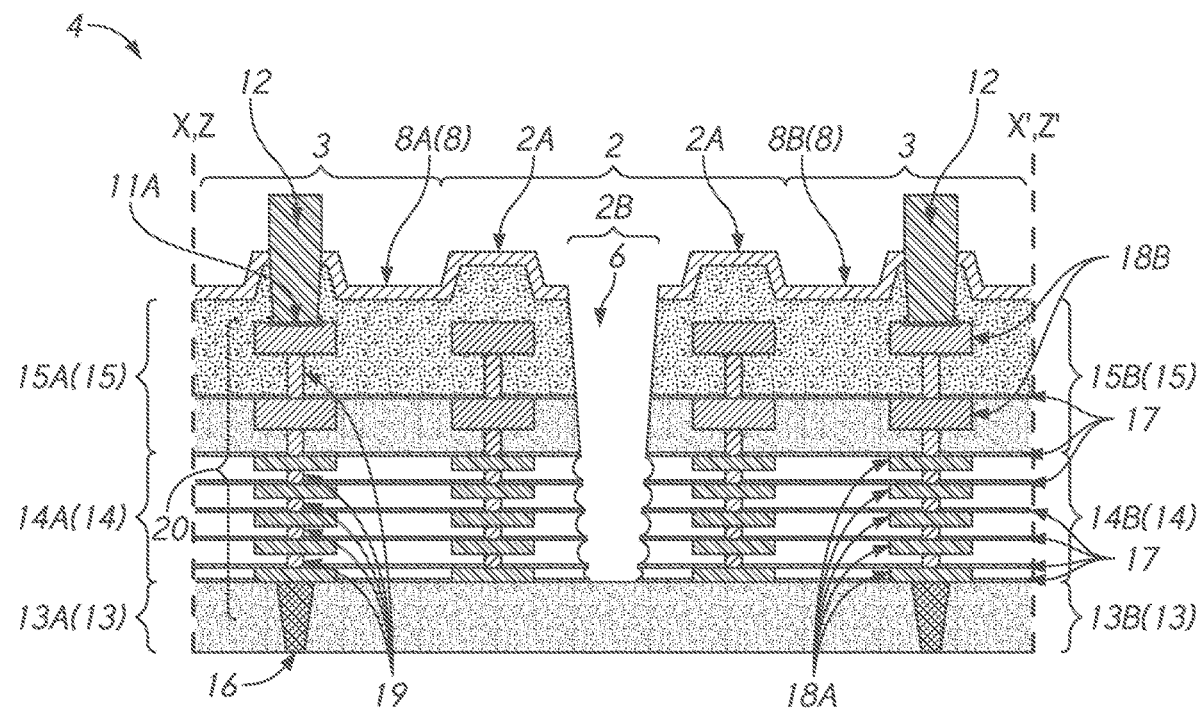
FIGS. 2B and 2C are diagrams illustrating vertical cross-sectional views of one schematic structure of the semiconductor device in accordance with an embodiment of the present disclosure.
Figure 2C:
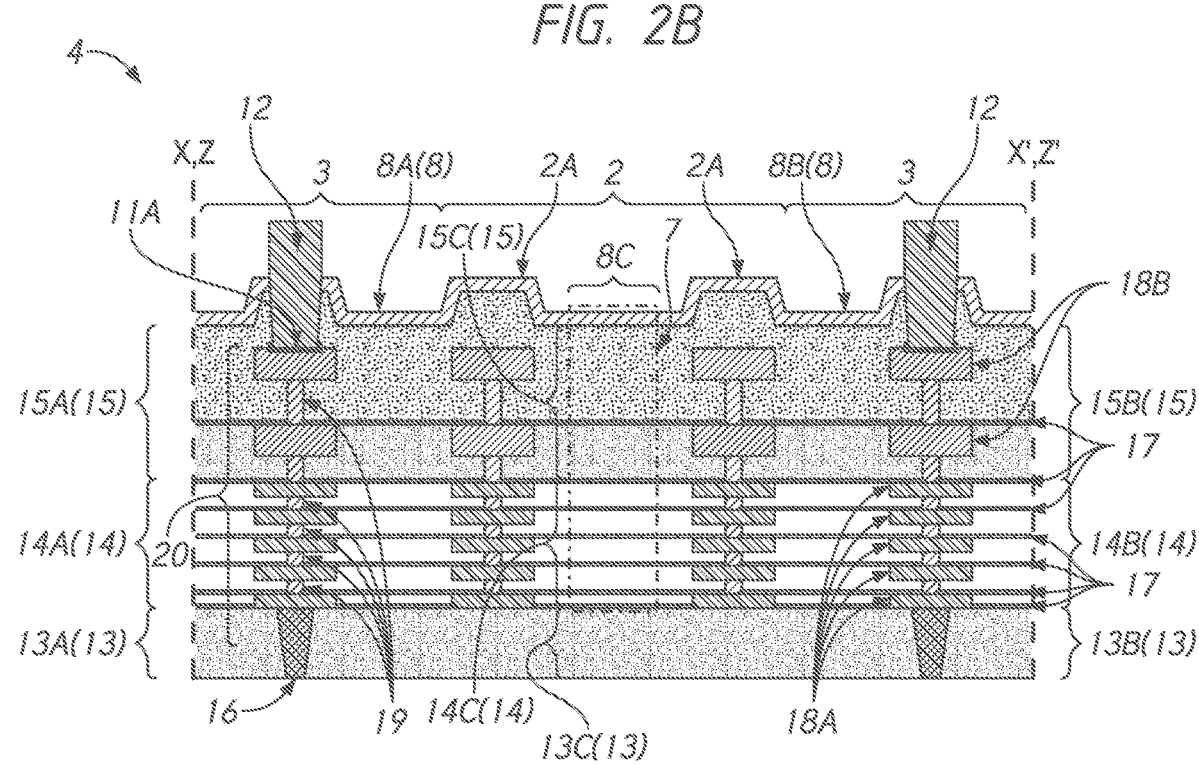

FIGS. 2B and 2C are diagrams illustrating vertical cross-sectional views of one schematic structure of the semiconductor device 100 in accordance with an embodiment of the present disclosure. FIG. 2B may be a cross-sectional view showing the portion 4 of the semiconductor device 100 along on a line X-X' or Z-Z' shown in FIG. 2A. FIG. 2C may be a cross-sectional view showing the portion 4 of the semiconductor device 100 along on a line Y-Y' shown in FIG. 2A.

The portion 4 of the semiconductor device 100 may include a semiconductor substrate 13. The semiconductor substrate 13 may include a monocrystalline silicon substrate, for example. Alternatively, the semiconductor substrate 13 may include silicon oxide (SiO2). The semiconductor substrate 13 may include portions 13A and 13B included in the chips 1A and 1B of FIG. 2A, respectively. The semiconductor substrate 13 may include through electrodes 16 in the circuit regions 3. The portion 4 of the semiconductor device 100 may also include dielectric layers 14 disposed on the semiconductor substrate 13. In some embodiments, the dielectric layers 14 may include a low-k insulating material having a low dielectric constant (k) that exhibits weak electric polarization between conductive components relative to dielectric materials, such as silicon dioxide (SiO2). For example, the low-k insulating material may include silicon oxycarbide (SiOC) and/or silicon carbonitride (SiCN). The dielectric layers 14 may include portions 14A and 14B included in the chips 1A and 1B of FIG. 2A, respectively. The portion 14A may be disposed in the circuit region 3 of the chip 1A and the edge 2A of the chip 1A facing the edge 2A of the adjacent chip 1B. The portion 14B may be disposed in the circuit region 3 of the chip 1B and the edge 2A of the chip 1B facing the edge 2A of the adjacent chip 1A. The portion 4 of the semiconductor device 100 may also include conductive wires 18A disposed in the dielectric layers 14. In some embodiments, the conductive wires 18A may include copper (Cu). The portion 4 of the semiconductor device 100 may also include dielectric layers 15 disposed on the dielectric layers 14. In some embodiments, the dielectric layers 15 may include silicon dioxide (SiO2). The dielectric layers 15 may also include a substance such as phosphorus (P) or boron (B). The dielectric layers 15 may include portions 15A and 15B included in the chips 1A and 1B of FIG. 2A, respectively. The portion 15A may be disposed in the circuit region 3 of the chip 1A and the edge 2A of the chip 1A facing the edge 2A of the adjacent chip 1B. The portion 15B may be disposed in the circuit region 3 of the chip 1B and the edge 2A of the chip 1B facing the edge 2A of the adjacent chip 1A. The portion 4 of the semiconductor device 100 may also include conductive wires 18B disposed in the dielectric layers 15. In some embodiments, the conductive wires 18B may include aluminum (Al). The substrate 13, the dielectric layers 14 and 15 may be insulated from one another by dielectric layers 17 disposed between the adjacent dielectric layers 14 and 15, and the substrate 13 and the dielectric layer 14 adjacent to the substrate 13. In some embodiments, the dielectric layers 17 may include silicon nitride (Si3N4). The portion 4 of the semiconductor device 100 may include interconnects 20. Each interconnect 20 may include through electrodes 19. Each through electrode 19 may be disposed through two adjacent layers of the dielectric layers 14 and 15, and the dielectric layer 17 between the two adjacent layers. The interconnect 20 may couple (e.g., electrically connect) the conductive wires 18A and the conductive wire 18B to the through electrode 16. The interconnects 20 may be disposed in the circuit region 3. In some embodiments, the interconnects 20 may be further disposed in the edges 2A of the semiconductor chips 1. In some embodiments, a portion of the interconnects 20 may be included in test circuits (not shown) disposed in the edges 2A of the semiconductor chips 1.

The portion 4 of the semiconductor device 100 may further include a cover layer 8. The cover layer 8 may include portions 8A and 8B defined by edges 2A of the chips 1A and 1B of FIG. 2A, respectively. In some embodiments, the cover layer 8 may be a dielectric layer including silicon nitride (Si3N4) and/or silicon carbide (SiC). The cover layer 8 and the dielectric layers 17 may prevent diffusion of the conductive material (e.g., copper diffusion). The portion 4 of the semiconductor device 100 may further include conductive seed/barrier layers 11A disposed on the conductive wires 18B in the dielectric layer 15 at an end, opposite to another end on the substrate 13, of the interconnect 20 in the circuit region 3. The portion 4 of the semiconductor device 100 may also include conductive pillars 12 through the cover layer 8 and a portion of the dielectric layer 15 in the circuit region 3. The conductive pillars 12 may be disposed on the conductive seed/barrier layers 11A in the circuit region 3. Thus, each of interconnects 20 under each of conductive pillars 12 may couple each of the conductive pillars 12 and the corresponding conductive wires 18A and 18B to each corresponding through electrode 16 under each of the conductive pillars 12.

The portion 4 of the semiconductor device 100 may include a groove 6 disposed in a cut region 2B between the edges 2A in the scribe region 2 as shown in FIG. 2B. In some embodiments, the groove 6 may be formed by etching the cut region 2B. The cross-section along the line X-X' or Z-Z' may include a cross-section of the groove 6 along the line X-X' or Z-Z', respectively. Edge surfaces of the dielectric layers 14 facing the groove 6 may have roughness. The edge surfaces of the dielectric layers 14 may include concave portions along cut cross sections of the dielectric layers 14 facing the groove 6, for example. In another example, the edge surfaces of the dielectric layers 14 may be uneven.

In some embodiments, a portion of the dielectric layer 15 beneath the cover layer 8 including the wire 18B may have a thickness greater than a thickness of the portion of the dielectric layer 15 between the edge 2A and the conductive pillar 12 of the chip 1 in the same cross-section. In some embodiments, the portion of the dielectric layer 15 having the greater thickness may include the conductive pillar 12. In some embodiments, the portion of the dielectric layer 15 having the greater thickness may be in the edge 2A. The thicker portion of the dielectric layer 15 may provide support for the portion 4 including the interconnects 20, suppressing cracks around the interconnects 20 in the circuit regions 3 and edges 2A.

The portion 4 of the semiconductor device 100 may include a support structure 7 disposed in a cut region 2B between the edges 2A of chips 1A and 1B as shown in FIG. 2C. In some embodiments, the support structure 7 may include a portion 14C of the dielectric layers 14, a portion 15C of the dielectric layers 15 and a portion of the dielectric layer 17 on a portion 13A of the substrate 13. The support structure 7 may also include a portion 8C of the cover layer 8 on the portion 15C of the dielectric layers 15. The portions 13C, 14C, 15C and 8C of the support structure 7 may be continuous with the portions 13A, 14A, 15A and 8A of the chip 1A and the portions 13B, 14B, 15B and 8B of the chip 1B, respectively. In some embodiments, the support structure 7 may be formed by not being removed after etching the groove 6. Processes of providing the support structure 7 may be described in details later in this disclosure. The cross-section along the line Y-Y' may include a cross-section of the support structure 7 along the line Y-Y'.

Processes of providing the groove 6, the support structure 7 and the conductive pillar 12 of the semiconductor device 100 in accordance with an embodiment of the present disclosure will be described with reference to FIGS. 3A to 10C. A semiconductor substrate 13, dielectric layers 14 and 17 disposed on the semiconductor substrate 13, conductive wires 18A and 18B, and interconnects 20 including through electrodes 19 in FIGS. 3A to 10C have similar structures as the semiconductor substrate 13, the dielectric layers 14 and 17, the conductive wires 18A and 18B, and the through electrodes 19 in FIG. 2C. Thus the description of the structures of the semiconductor substrate 13, the dielectric layers 14 and 17 disposed on the semiconductor substrate 13, the conductive wires 18A, and the through electrodes 19 is omitted for brevity.

Figure 3A:
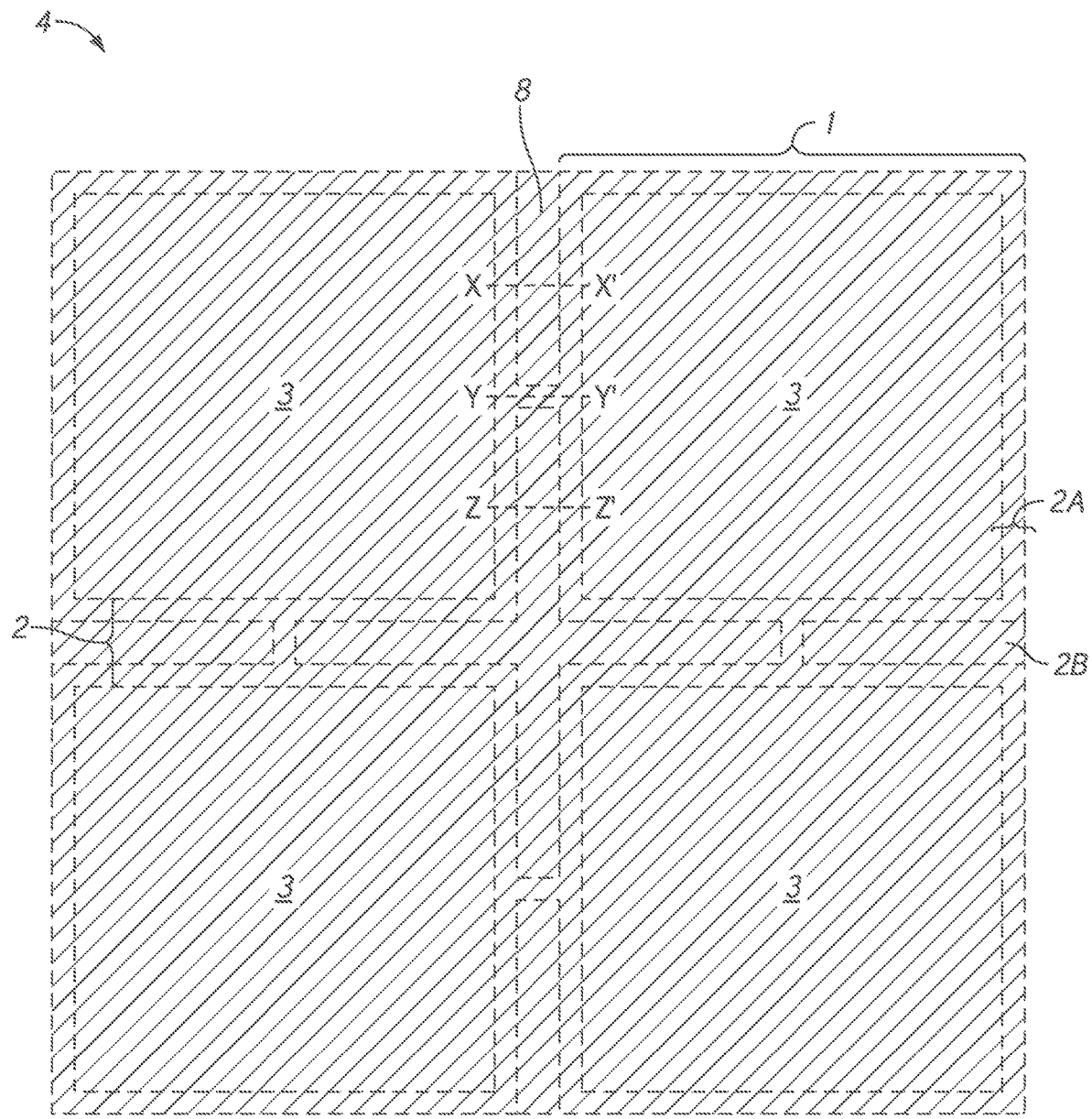
FIG. 3A is a layout diagram of a portion of a semiconductor device in accordance with an embodiment of the present disclosure.

FIG. 3A is a layout diagram of a portion 4 of a semiconductor device 100 in accordance with an embodiment of the present disclosure. FIG. 3A may be a plan view of the portion 4 of the semiconductor device 100 before etching for formation of grooves 6 in FIGS. 2A-2C. The portion 4 may include semiconductor chips 1 before separation. The portion 4 may include circuit regions to be included in corresponding semiconductor chips 1. The portion 4 may also include edges 2A of the semiconductor chips 1 surrounding circuit regions 3. The portion 4 may include a scribe region 2 disposed between the circuit regions 3. The scribe region 2 may include the edges 2A of the semiconductor chips 1 and cut regions 2B between adjacent edges 2A of adjacent semiconductor chips 1. A cover layer 8 may be disposed on a top of the portion 4. In some embodiments, the cover layer 8 may be a dielectric film. For example, the cover layer 8 may include silicon nitride (Si3N4) and/or silicon carbide (SiC).

Figure 3B:
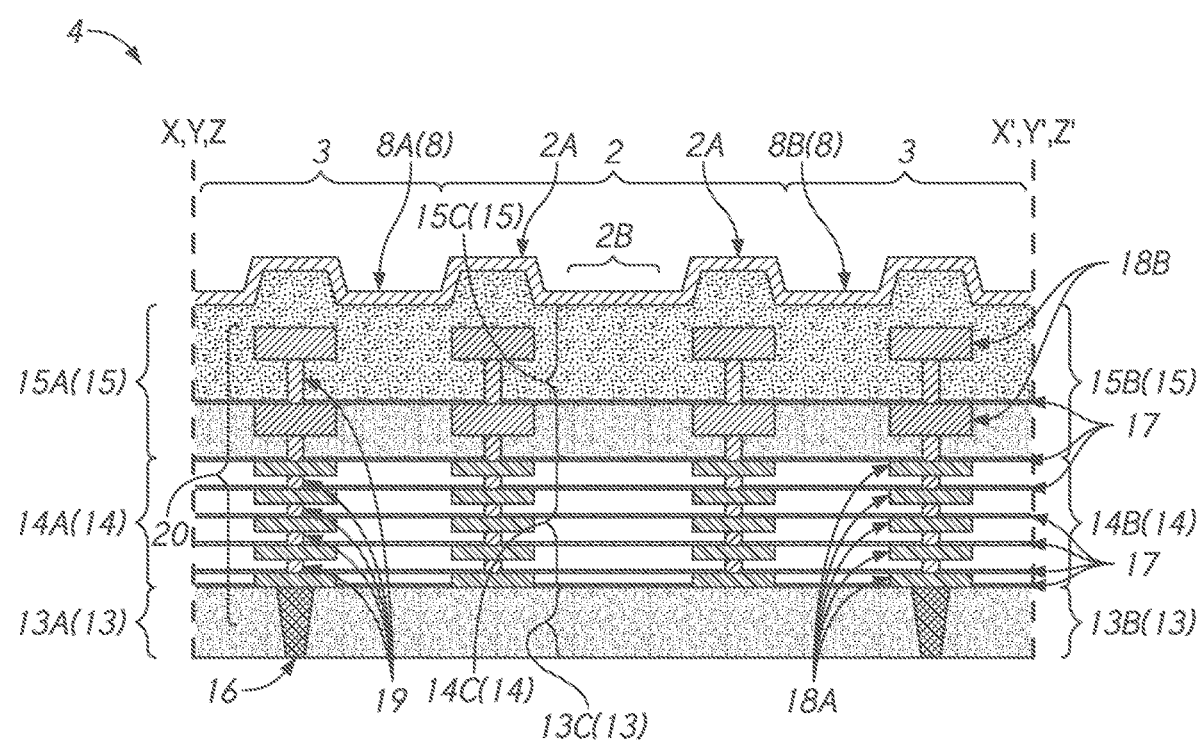
FIG. 3B is a diagram illustrating a vertical cross-sectional view of one schematic structure of the semiconductor device in accordance with an embodiment of the present disclosure.

FIG. 3B is a diagram illustrating a vertical cross-sectional view of one schematic structure of the semiconductor device 100 in accordance with an embodiment of the present disclosure. In some embodiments, FIG. 3B may be a cross-sectional view of the portion 4 of the semiconductor device 100 along on a line X-X', Y-Y' or Z-Z' shown in FIG. 3A. Before etching processes, the cut region 2B may include the semiconductor substrate 13, the dielectric layers 14, 15 and 17 and a cover layer 8 included in cross-sections along lines X-X', Y-Y' and Z-Z'. For example, one of the dielectric layers 17 may be formed on the semiconductor substrate 13. A dielectric layer 14, such as a dielectric layer including low-k material, and a dielectric layer 17 may be formed repeatedly while wires 18A and through electrode 19 coupling the wires 18A may be formed through the dielectric layers 14 and the dielectric layers 17. In some embodiments, the dielectric layer 14 including low-k material films are formed by a chemical vapor deposition (CVD) method, for example. A dielectric layer 15, such as a dielectric layer including silicon dioxide and a dielectric layer 17 on the dielectric layer 15 may be formed repeatedly while wires 18B and through electrode 19 coupling the wires 18B to the wires 18A may be formed through the dielectric layers 15 and the dielectric layers 17. A top dielectric layer 15 may be formed on the dielectric layer 17. In some embodiments, portions of the top dielectric layer 15 including the wires 18B may have a thickness greater than regions of the top dielectric layer 15 between the wires 18B. The thicker portions of the top dielectric layer 15 may provide support for the portion 4 including interconnects 20, suppressing cracks around the interconnects 20 in the circuit regions 3.

Figure 4A:
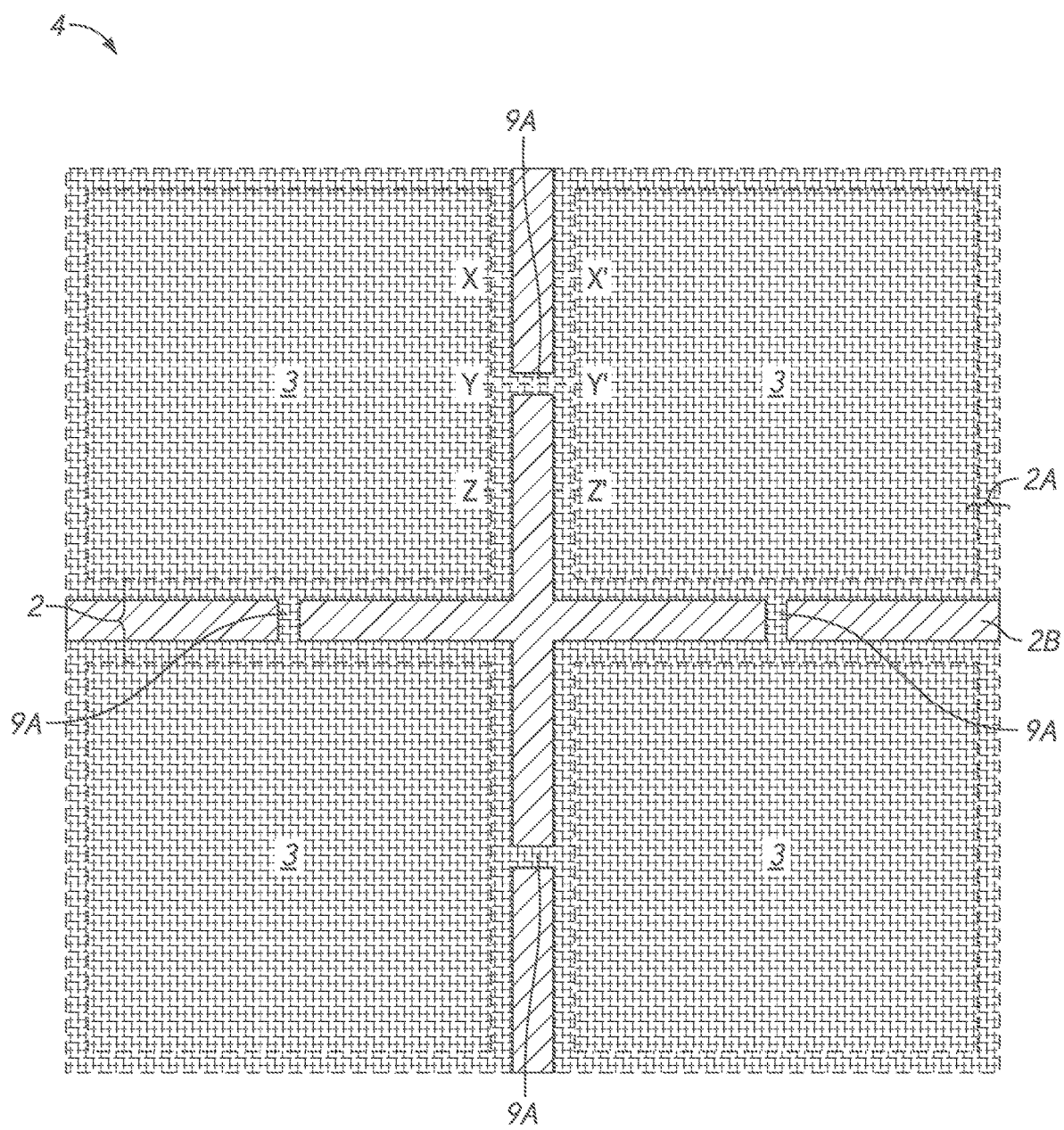
FIG. 4A is a layout diagram of a portion of a semiconductor device in accordance with an embodiment of the present disclosure.
Figure 4B:
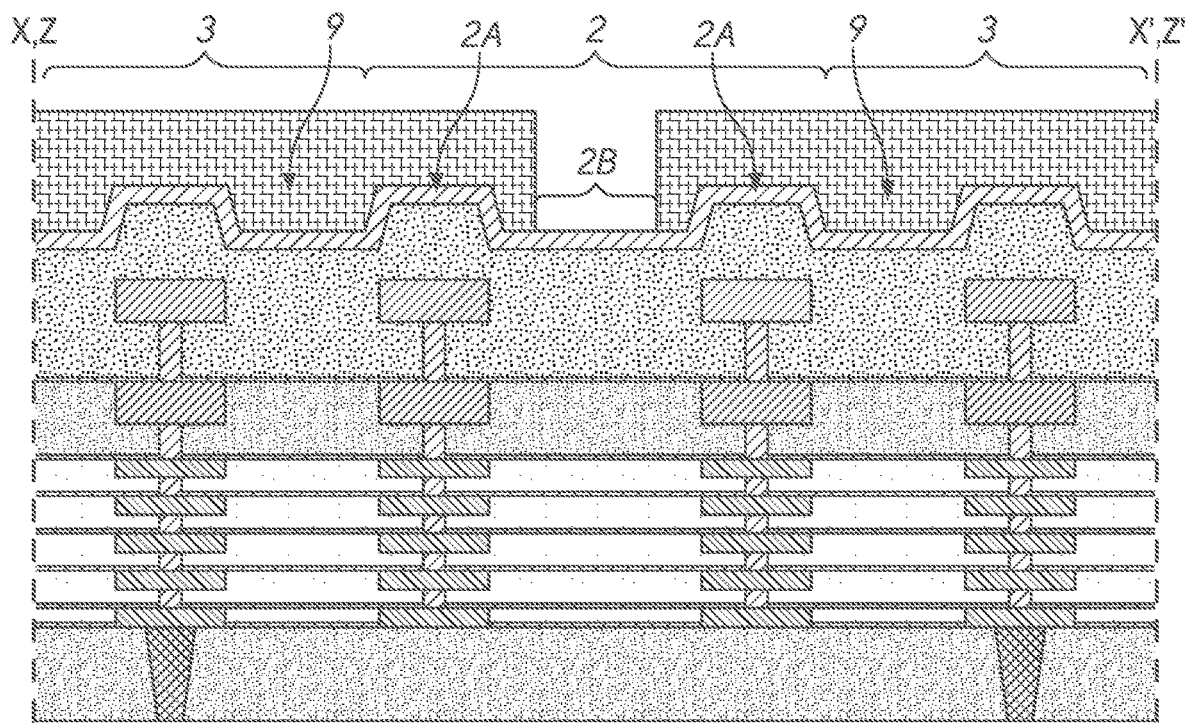
FIGS. 4B and 4C are diagrams illustrating vertical cross-sectional views of one schematic structure of the semiconductor device in accordance with an embodiment of the present disclosure.
Figure 4C:
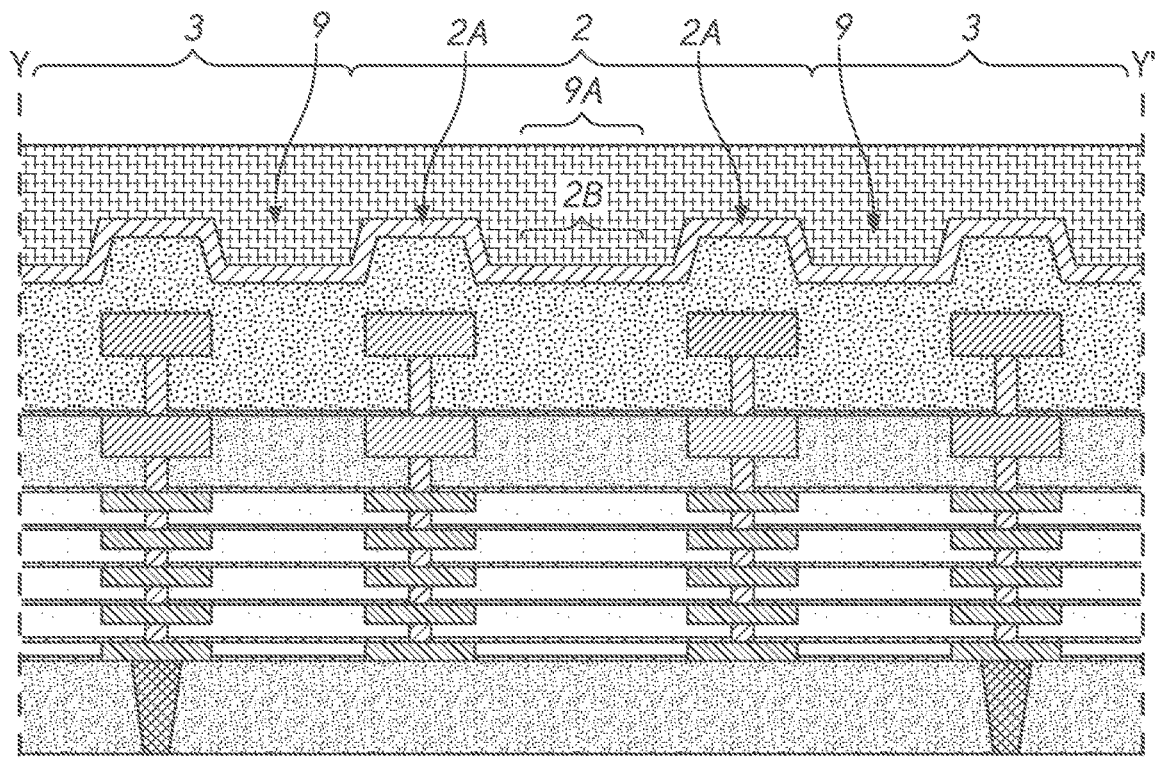

FIG. 4A is a layout diagram of a portion 4 of a semiconductor device 100 in accordance with an embodiment of the present disclosure. FIGS. 4B and 4C are diagrams illustrating vertical cross-sectional views of one schematic structure of the semiconductor device 100 in accordance with an embodiment of the present disclosure. FIG. 4A may be a plan view of the portion 4 of the semiconductor device 100 after forming a photoresist 9 before etching for formation of grooves 6 in FIGS. 2A-2C. FIG. 4B may be a cross-sectional view showing the portion 4 of the semiconductor device 100 along on a line X-X' or Z-Z' shown in FIG. 4A. FIG. 4C may be a cross-sectional view showing the portion 4 of the semiconductor device 100 along on a line Y-Y' shown in FIG. 4A.

The photoresist 9 may be disposed on the cover layer 8 to cover the cover layer 8 on circuit regions 3 and edges 2A in a scribe region 2 surrounding the circuit regions 3. The photoresist 9 may be disposed by photo patterning using a reticle, for example. In some embodiments, the photoresist 9 may cover the portion 4 of the semiconductor device 100. The photoresist 9 may include portions 9A to cover portions 8C of the cover layer 8 in the cut regions 2B between the edges 2A in the scribe region 2 in a cross-section along the line Y-Y' in FIG. 4C. Because the cut region 2B in the cross-section along the line Y-Y' in FIG. 4C is covered by the portion 9A of the photoresist 9, the structure under the portion 9A is not exposed and may not be removed by etching, thus the support structures 7 of FIG. 2A under the portions 9A may be formed. The cut region 2B in a cross-section along the line X-X' or Z-Z' in FIG. 4B is not covered by the portion 9A of the photoresist 9. Thus the photoresist 9 may expose a portion of the cover layer 8 in the cut region 2B in the cross-section along the line X-X' or Z-Z'. Thus the cut region 2B including the exposed portions of the cover layer 8 and the dielectric layers under the exposed portions of the cover layer 8 may be subject to etching to form the grooves 6. Etching may be dry etching or wet etching.

Figure 5A:
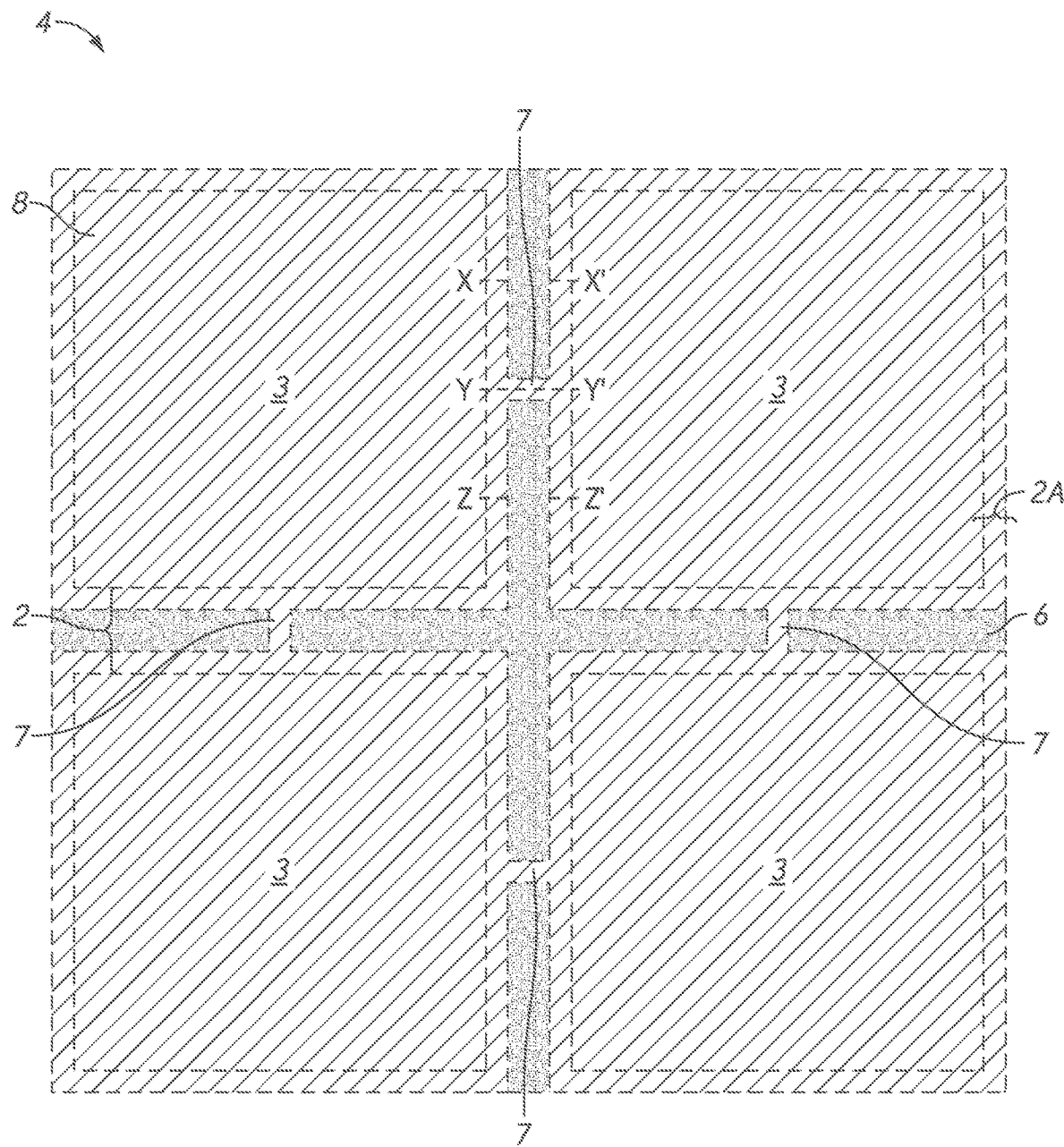
FIG. 5A is a layout diagram of a portion of a semiconductor device in accordance with an embodiment of the present disclosure.
Figure 5B:
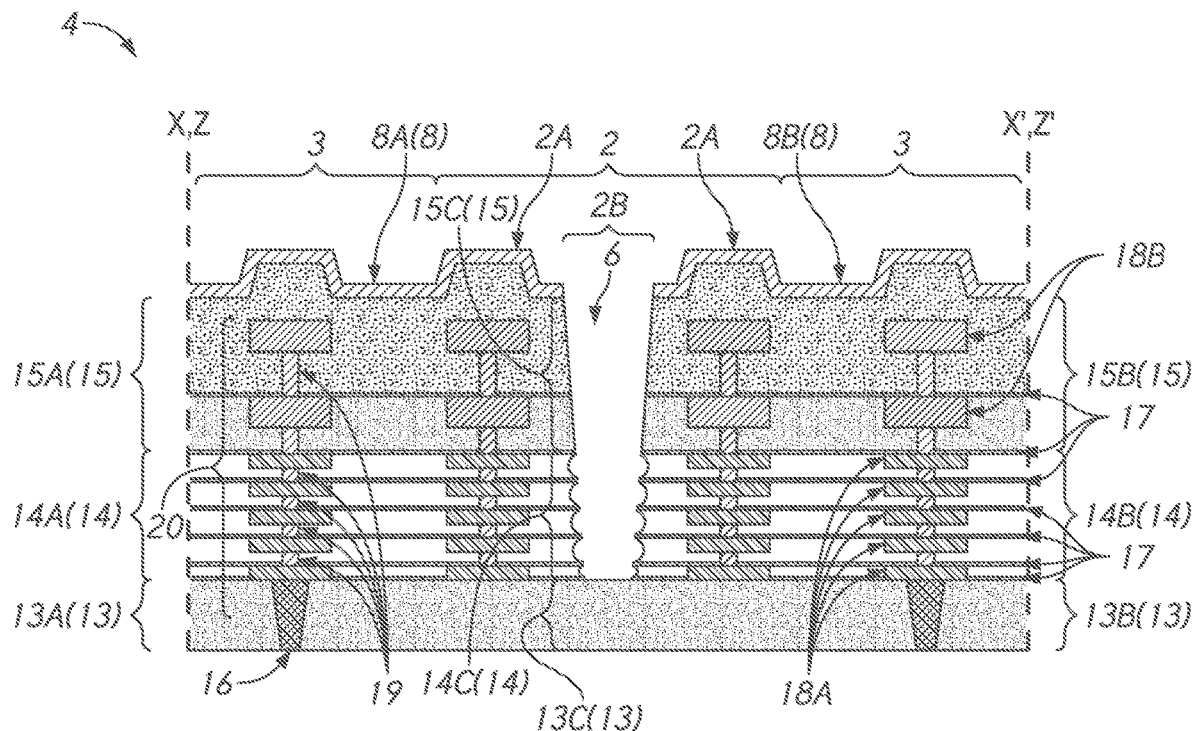
FIGS. 5B and 5C are diagrams illustrating vertical cross-sectional views of one schematic structure of the semiconductor device in accordance with an embodiment of the present disclosure.
Figure 5C:
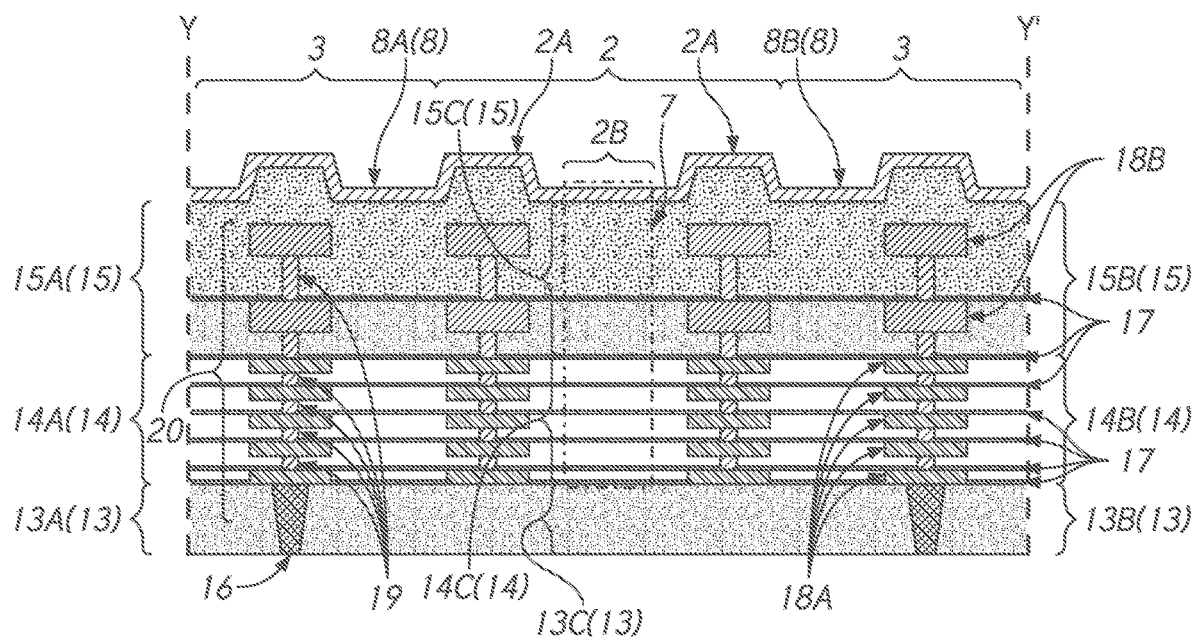

FIG. 5A is a layout diagram of a portion 4 of a semiconductor device 100 in accordance with an embodiment of the present disclosure. FIGS. 5B and 5C are diagrams illustrating vertical cross-sectional views of one schematic structure of the semiconductor device 100 in accordance with an embodiment of the present disclosure. FIG. 5A may be a plan view of the portion 4 of the semiconductor device 100 after etching for formation of grooves 6 in FIGS. 2A-2C. FIG. 5B may be a cross-sectional view showing the portion 4 of the semiconductor device 100 along on a line X-X' or Z-Z' shown in FIG. 5A. FIG. 5C may be a cross-sectional view showing the portion 4 of the semiconductor device 100 along on a line Y-Y' shown in FIG. 5A.

After etching the exposed cut regions 2B through the cover layer 8 and dielectric layers 14, 15 and 17 in FIGS. 4A and 4B, grooves 6 above may be formed. In some embodiments, etching may be performed until the etching is stopped by the semiconductor substrate 13. Thus, the grooves may be disposed on or above the semiconductor substrate 13. The grooves 6 may have edge surfaces including concave portions along cut cross sections of the dielectric layers 14 facing the grooves 6 as shown in FIG. 5B. Concurrently with forming the grooves 6, support structures 7 between edges 2A and grooves 6 may be formed as remaining portions of the cover layer 8 and dielectric layers 14, 15 and 17 in the cut region 2B. The support structures 7 may include ends on the adjacent edges 2A and sides facing the grooves 6. A photoresist 9 on the cover layer 8 may be removed from the portion 4 of the semiconductor device 100, and the cover layer 8 on the circuit regions 3, edges 2A and the support structures 7 may be exposed.

Figure 6A:
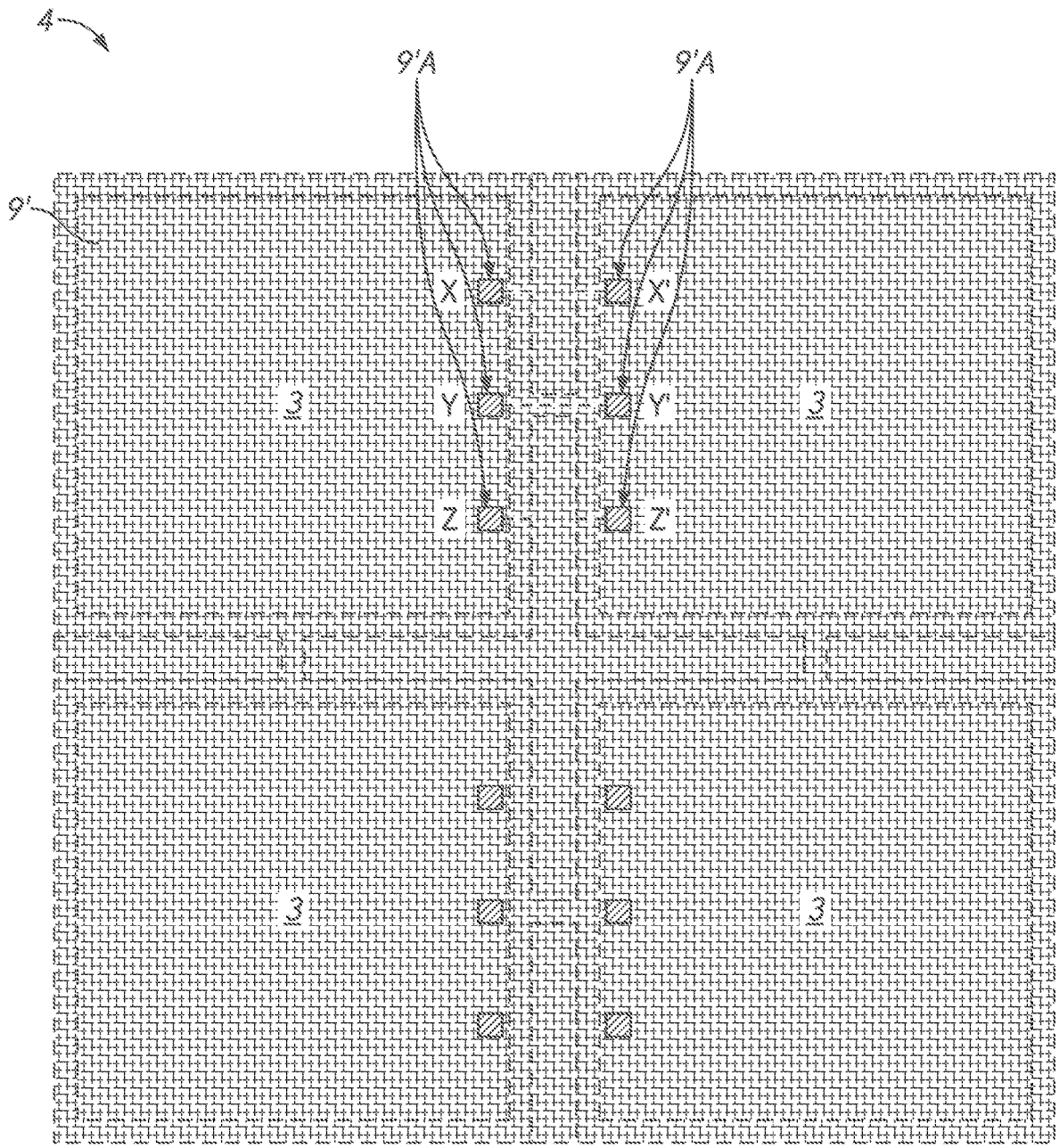
FIG. 6A is a layout diagram of a portion of a semiconductor device in accordance with an embodiment of the present disclosure.
Figure 6B:
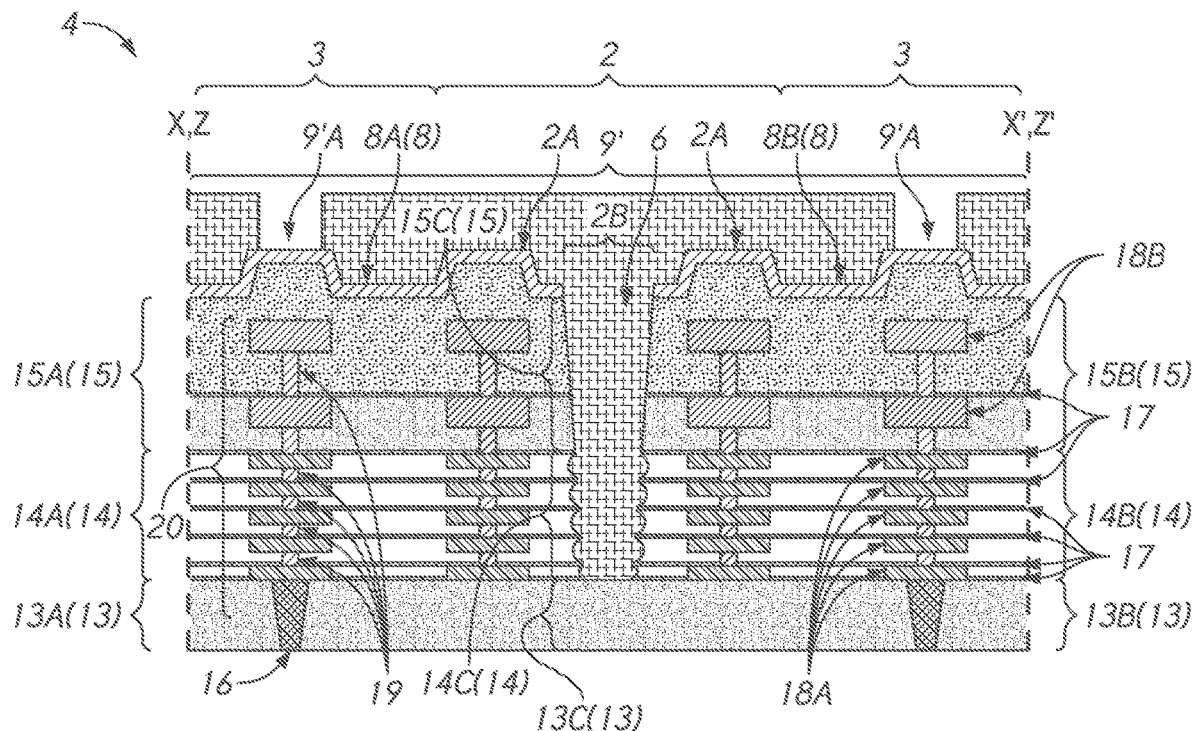
FIGS. 6B and 6C are diagrams illustrating vertical cross-sectional views of one schematic structure of the semiconductor device in accordance with an embodiment of the present disclosure.
Figure 6C:
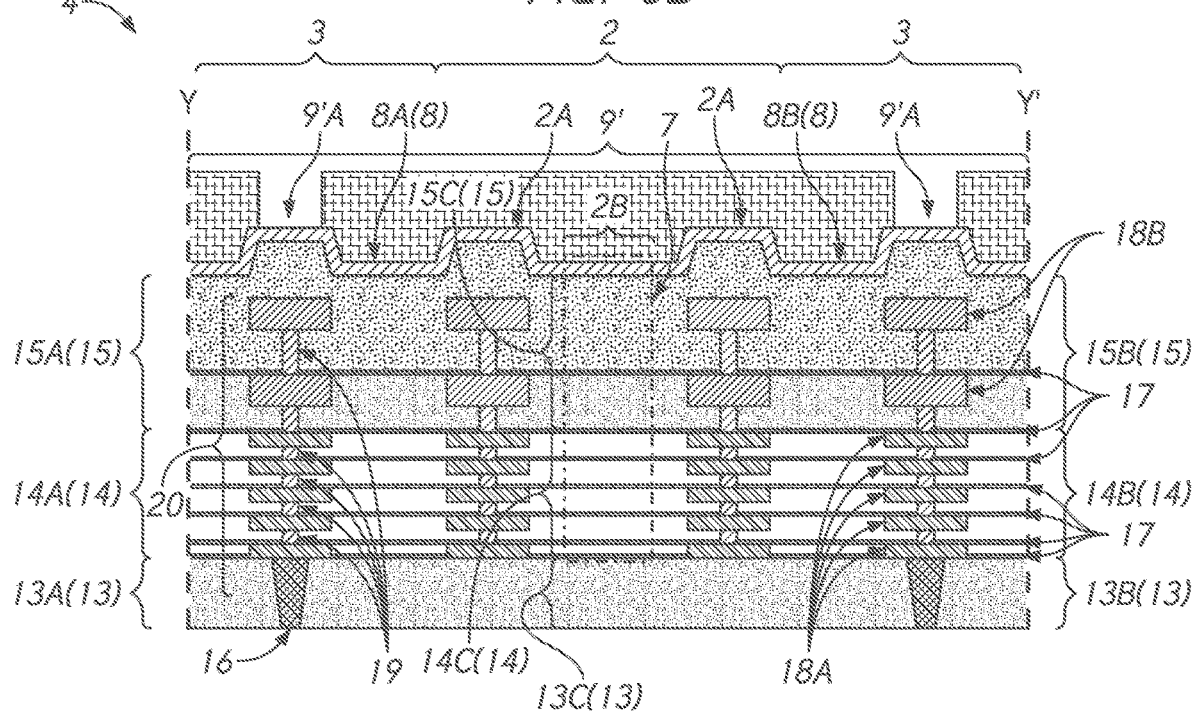

FIG. 6A is a layout diagram of a portion 4 of a semiconductor device 100 in accordance with an embodiment of the present disclosure. FIGS. 6B and 6C are diagrams illustrating vertical cross-sectional views of one schematic structure of the semiconductor device 100 in accordance with an embodiment of the present disclosure. FIG. 6A may be a plan view of the portion 4 of the semiconductor device 100 after forming a photoresist 9' before etching for formation of conductive pillars 12 in FIGS. 2A-2C. FIG. 6B may be a cross-sectional view showing the portion 4 of the semiconductor device 100 along on a line X-X' or Z-Z' shown in FIG. 6A. FIG. 6C may be a cross-sectional view showing the portion 4 of the semiconductor device 100 along on a line Y-Y' shown in FIG. 6A.

The photoresist 9' may be disposed on a cover layer 8 to cover the portion 4 of the semiconductor device 100. The photoresist 9' may be disposed by photo patterning, for example. The photoresist 9' may include holes 9'A to expose the cover layer 8 in circuit regions 3, to form conductive pillars 12. As shown in FIGS. 6B and 6C, the holes 9'A in a cross-section along the line X-X', Y-Y' or Z-Z' of FIG. 6A may be provided above interconnects 20 in the circuit regions 3. There may be no hole of the photoresist 9' in a scribe region 2. The photoresist 9' may be formed to fill the groove 6, as shown in FIG. 6B. Thus, the exposed portions of the cover layer 8 may be removed by etching. Furthermore, a portion of the dielectric layer 15 under the exposed portions of the cover layer 8 may be removed by etching until etching is stopped by the wires 18B on ends of the interconnects 20. Etching may be either dry etching or wet etching.

Figure 7A:
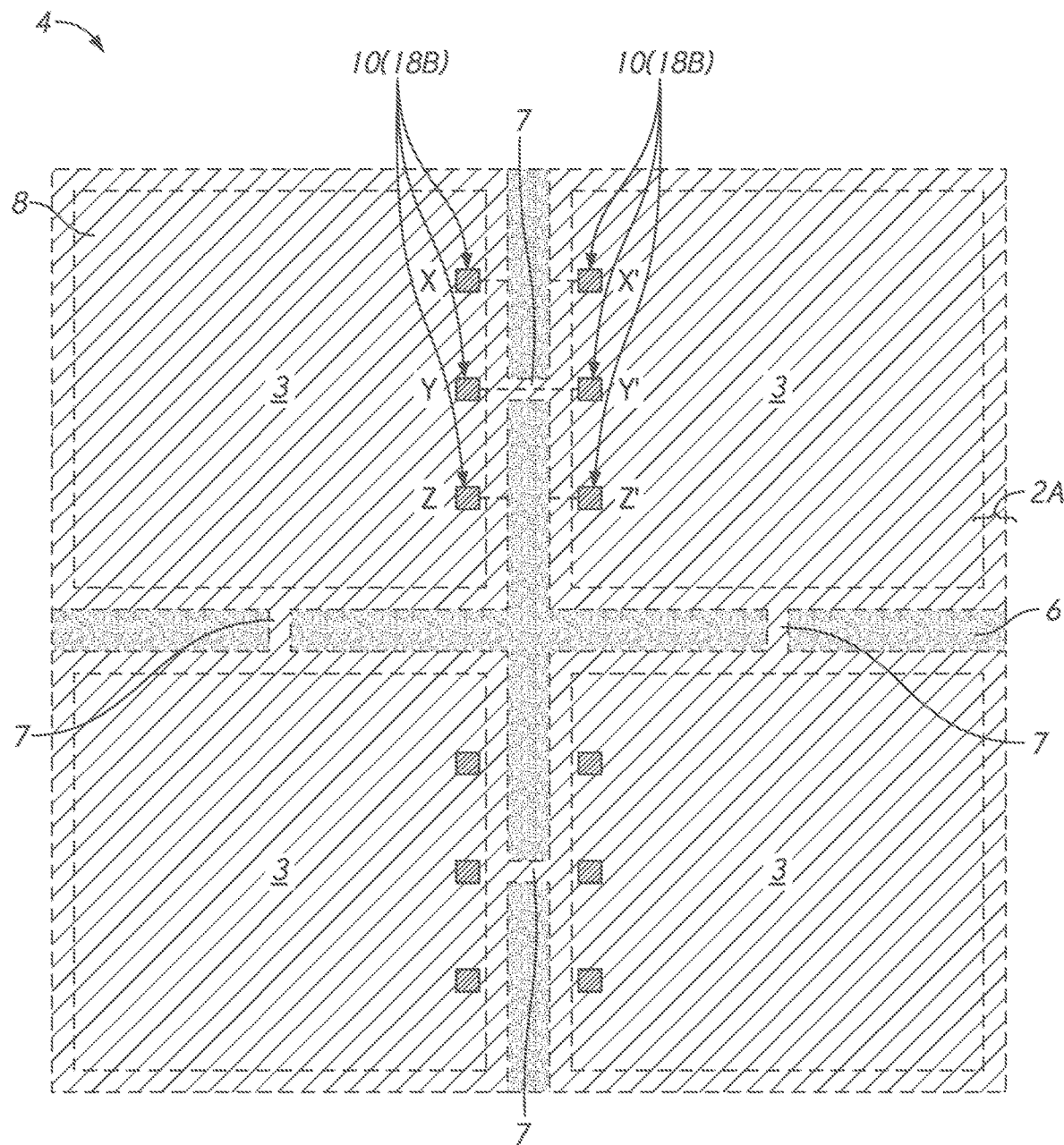
FIG. 7A is a layout diagram of a portion of a semiconductor device in accordance with an embodiment of the present disclosure.
Figure 7B:
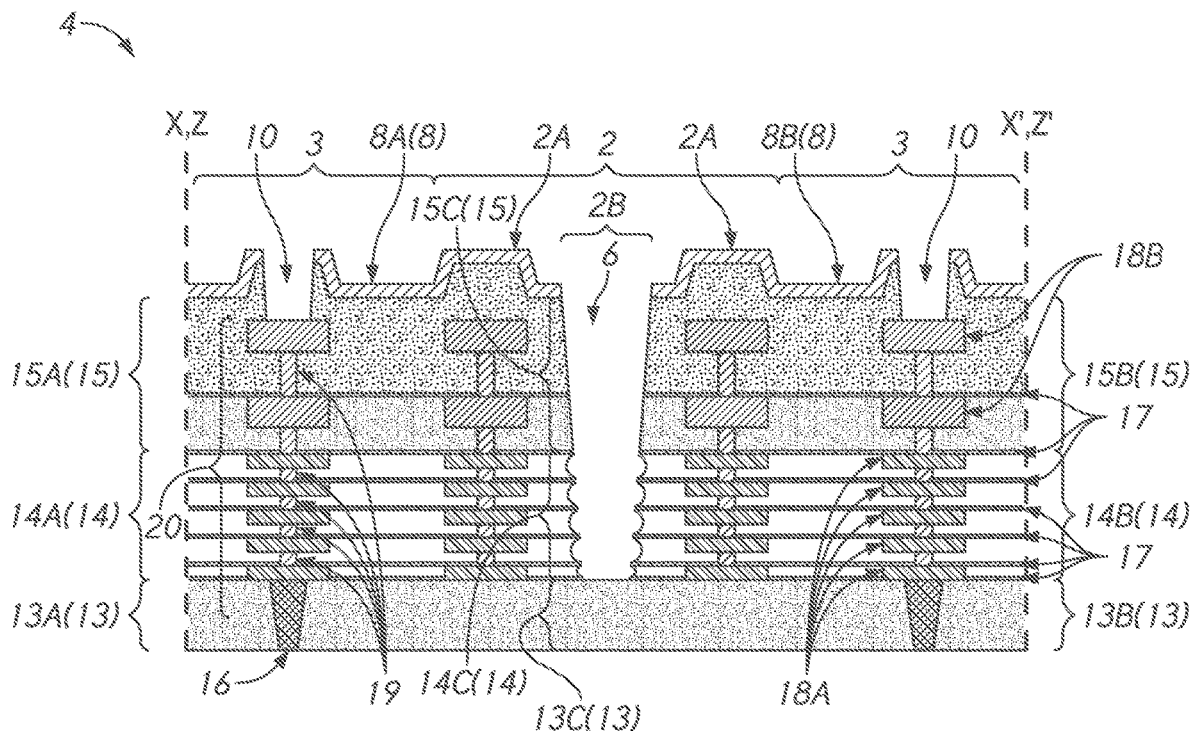
FIGS. 7B and 7C are diagrams illustrating vertical cross-sectional views of one schematic structure of the semiconductor device in accordance with an embodiment of the present disclosure.
Figure 7C:
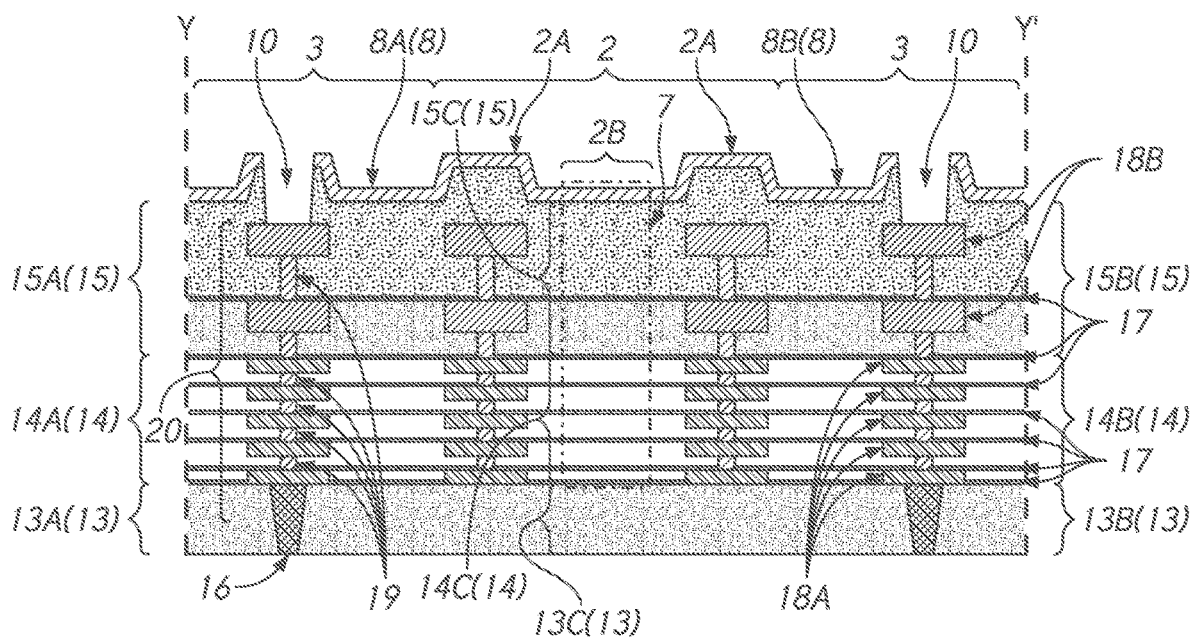

FIG. 7A is a layout diagram of a portion 4 of a semiconductor device 100 in accordance with an embodiment of the present disclosure. FIGS. 7B and 7C are diagrams illustrating vertical cross-sectional views of one schematic structure of the semiconductor device 100 in accordance with an embodiment of the present disclosure. FIG. 7A may be a plan view of the portion 4 of the semiconductor device 100 after etching for formation of conductive pillars 12 in FIGS. 2A-2C. FIG. 7B may be a cross-sectional view showing the portion 4 of the semiconductor device 100 along on a line X-X' or Z-Z' shown in FIG. 7A. FIG. 7C may be a cross-sectional view showing the portion 4 of the semiconductor device 100 along on a line Y-Y' shown in FIG. 7A.

After etching the cover layer 8 and the dielectric layer 15 beneath the cover layer in FIGS. 6A and 6B through the holes 9'A, holes 10 may be formed. In some embodiments, etching may be performed until exposing the wires 18B on ends of the interconnects 20 in the dielectric layer 15. A photoresist 9' of the FIGS. 6A-6C on the cover layer 8 may be removed from the portion 4 of the semiconductor device 100 after the etching. Grooves 6, the wires 18B at bottoms of the holes 10 and the cover layer 8 on the circuit regions 3, edges 2A and the support structures 7 may be exposed after the removal of the photoresist 9'.

Figure 8A:
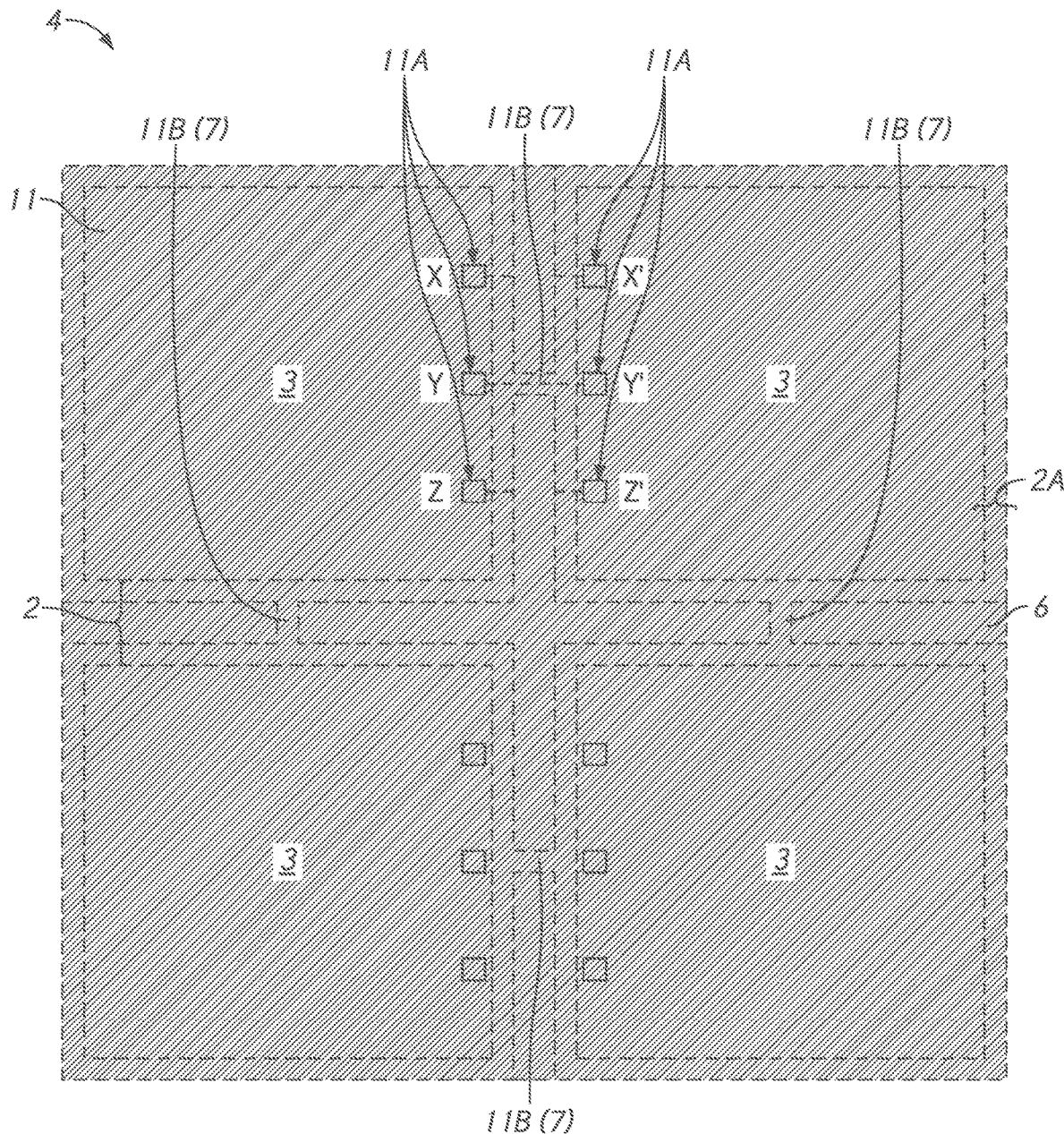
FIG. 8A is a layout diagram of a portion of a semiconductor device in accordance with an embodiment of the present disclosure.
Figure 8B:
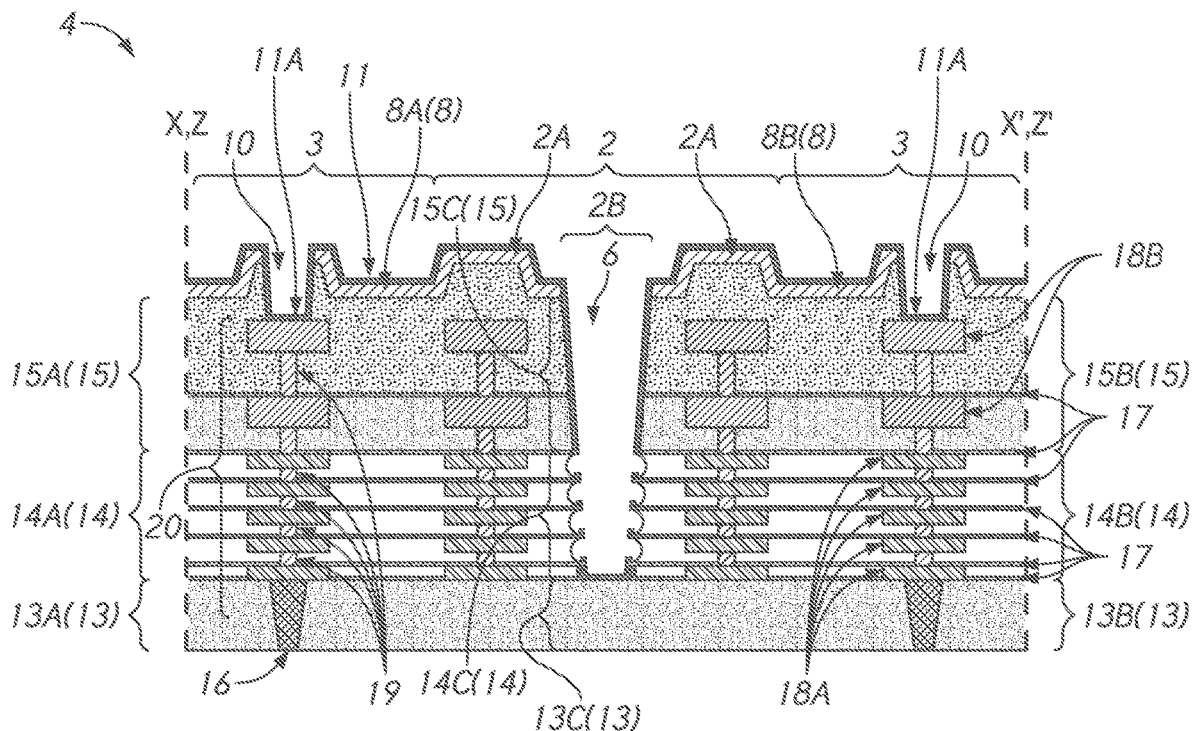
FIGS. 8B and 8C are diagrams illustrating vertical cross-sectional views of one schematic structure of the semiconductor device in accordance with an embodiment of the present disclosure.
Figure 8C:
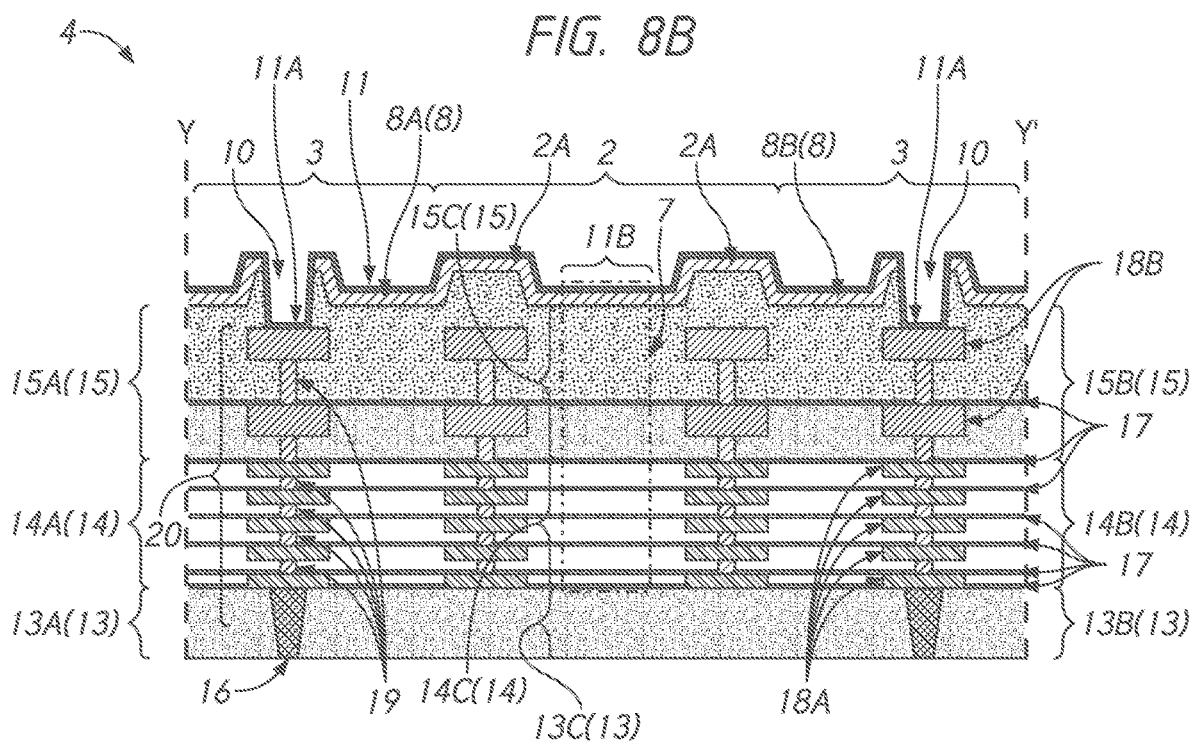

FIG. 8A is a layout diagram of a portion 4 of a semiconductor device 100 in accordance with an embodiment of the present disclosure. FIGS. 8B and 8C are diagrams illustrating vertical cross-sectional views of one schematic structure of the semiconductor device 100 in accordance with an embodiment of the present disclosure. FIG. 8A may be a plan view of the portion 4 of the semiconductor device 100 after forming a barrier and conductive seed layer 11 as a part of formation of conductive pillars 12 in FIGS. 2A-2C by electroplating. FIG. 8B may be a cross-sectional view showing the portion 4 of the semiconductor device 100 along on a line X-X' or Z-Z' shown in FIG. 8A. FIG. 8C may be a cross-sectional view showing the portion 4 of the semiconductor device 100 along on a line Y-Y' shown in FIG. 8A.

The barrier and conductive seed layer 11 may be deposited on a cover layer 8 to cover the portion 4 of the semiconductor device 100. In some embodiments, the barrier and conductive seed layer 11 may be deposited by a physical vapor deposition (PVD) method, such as sputtering. The barrier and conductive seed layer 11 may include a barrier film and a conductive seed film. The barrier film may include material with corrosion resistance, such as titanium nitride (TiN), for example. The conductive seed film may include copper (Cu) or nickel (Ni), for example. The barrier and conductive seed layer 11 may cover the holes 10, including edge surfaces and bottoms of the holes 10. The barrier and conductive seed layer 11 may include portions 11A on exposed wires 18B at the bottoms of the holes 10. As illustrated earlier, the groove 6 may have edge surfaces including concave portions along cut cross sections of the dielectric layers 14 facing a groove 6. Due to the concave portions of the groove 6, the barrier and conductive seed layer 11 may include gaps along dielectric layers 14 in the concave portions of the groove 6 as shown in FIG. 8B. The barrier and conductive seed layer 11 may include a portion 11B on a supporting structure 7 as shown in FIG. 8C. By including the portion 11B, all portions 11A of the barrier and conductive seed layer 11 may be coupled to the rest of the barrier and conductive seed layer 11.

Figure 9A:
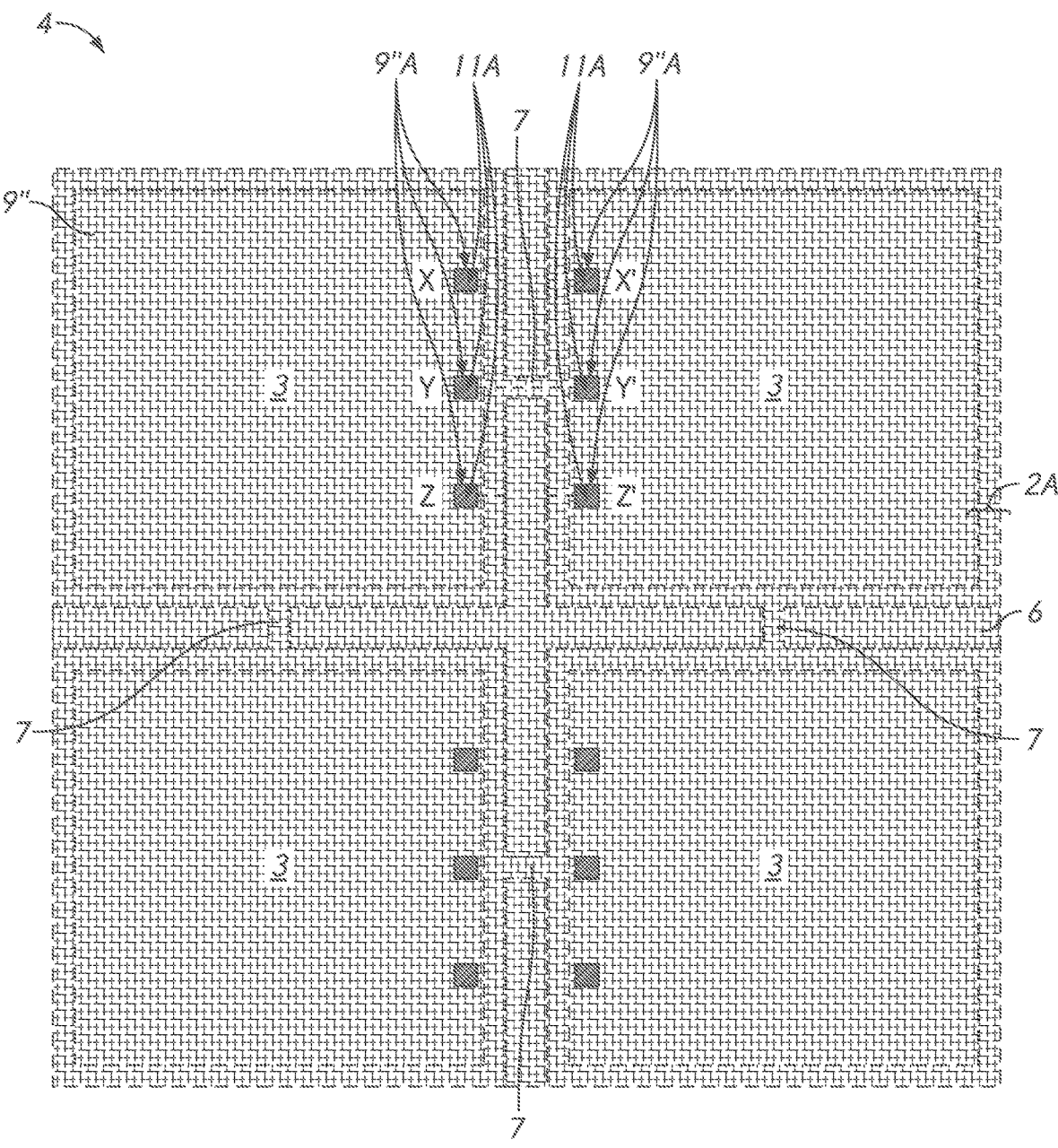
FIG. 9A is a layout diagram of a portion of a semiconductor device in accordance with an embodiment of the present disclosure.
Figure 9B:
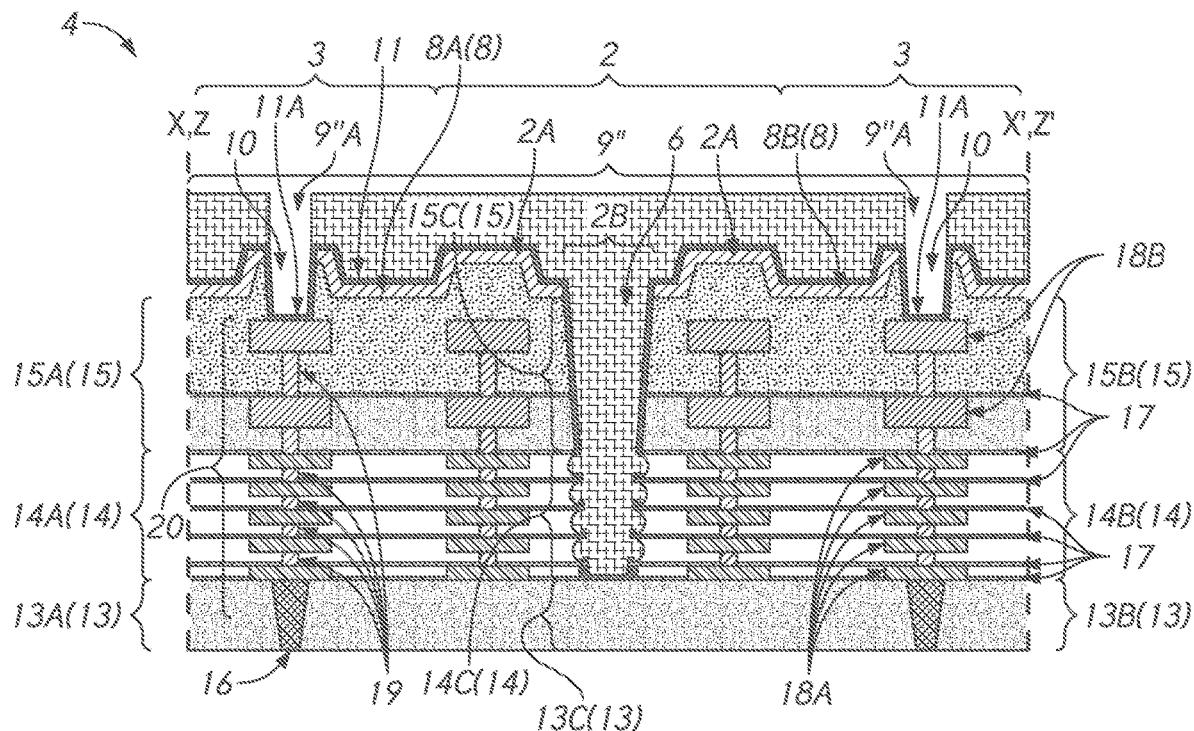
FIGS. 9B and 9C are diagrams illustrating vertical cross-sectional views of one schematic structure of the semiconductor device in accordance with an embodiment of the present disclosure.
Figure 9C:
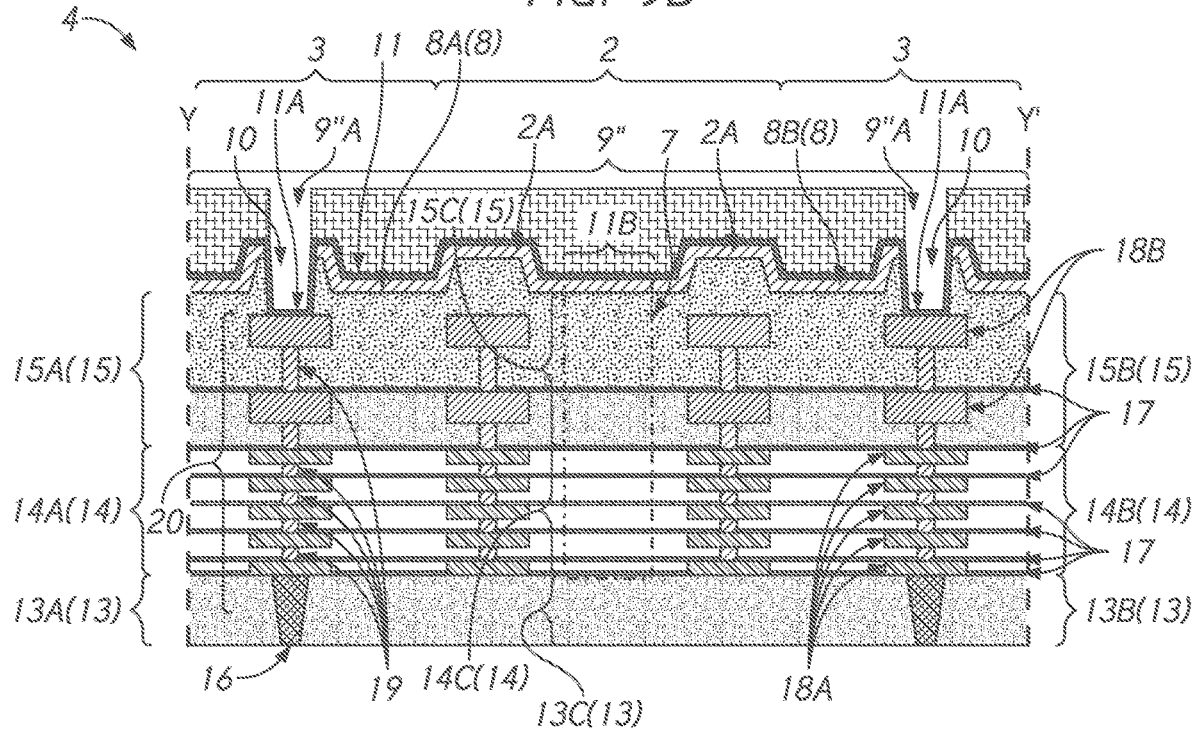

FIG. 9A is a layout diagram of a portion 4 of a semiconductor device 100 in accordance with an embodiment of the present disclosure. FIGS. 9B and 9C are diagrams illustrating vertical cross-sectional views of one schematic structure of the semiconductor device 100 in accordance with an embodiment of the present disclosure. FIG. 9A may be a plan view of the portion 4 of the semiconductor device 100 after forming a photoresist 9" before electroplating for formation of conductive pillars 12 in FIGS. 2A-2C. FIG. 9B may be a cross-sectional view showing the portion 4 of the semiconductor device 100 along on a line X-X' or Z-Z' shown in FIG. 9A. FIG. 9C may be a cross-sectional view showing the portion 4 of the semiconductor device 100 along on a line Y-Y' shown in FIG. 9A.

The photoresist 9" may be disposed on a barrier and conductive seed layer 11 to cover the portion 4 of the semiconductor device 100. The photoresist 9' may be disposed by photo patterning, for example. The photoresist 9" may include holes 9"A to expose portions 11A of the barrier and conductive seed layer 11 to form conductive pillars 12. As shown in FIGS. 9B and 9C, the holes 9"A in a cross-section along the line X-X', Y-Y' or Z-Z' of FIG. 9A may be provided above interconnects 20 in the circuit regions 3. There may be no hole of the photoresist 9" in a scribe region 2 as shown in FIGS. 9B and 9C. The photoresist 9" may be formed to fill the groove 6, as shown in FIG. 9B. The photoresist 9" may be formed to cover portions 11B of the barrier and conductive seed layer 11 above the support structure 7 as shown in FIG. 9C.

Figure 10A:
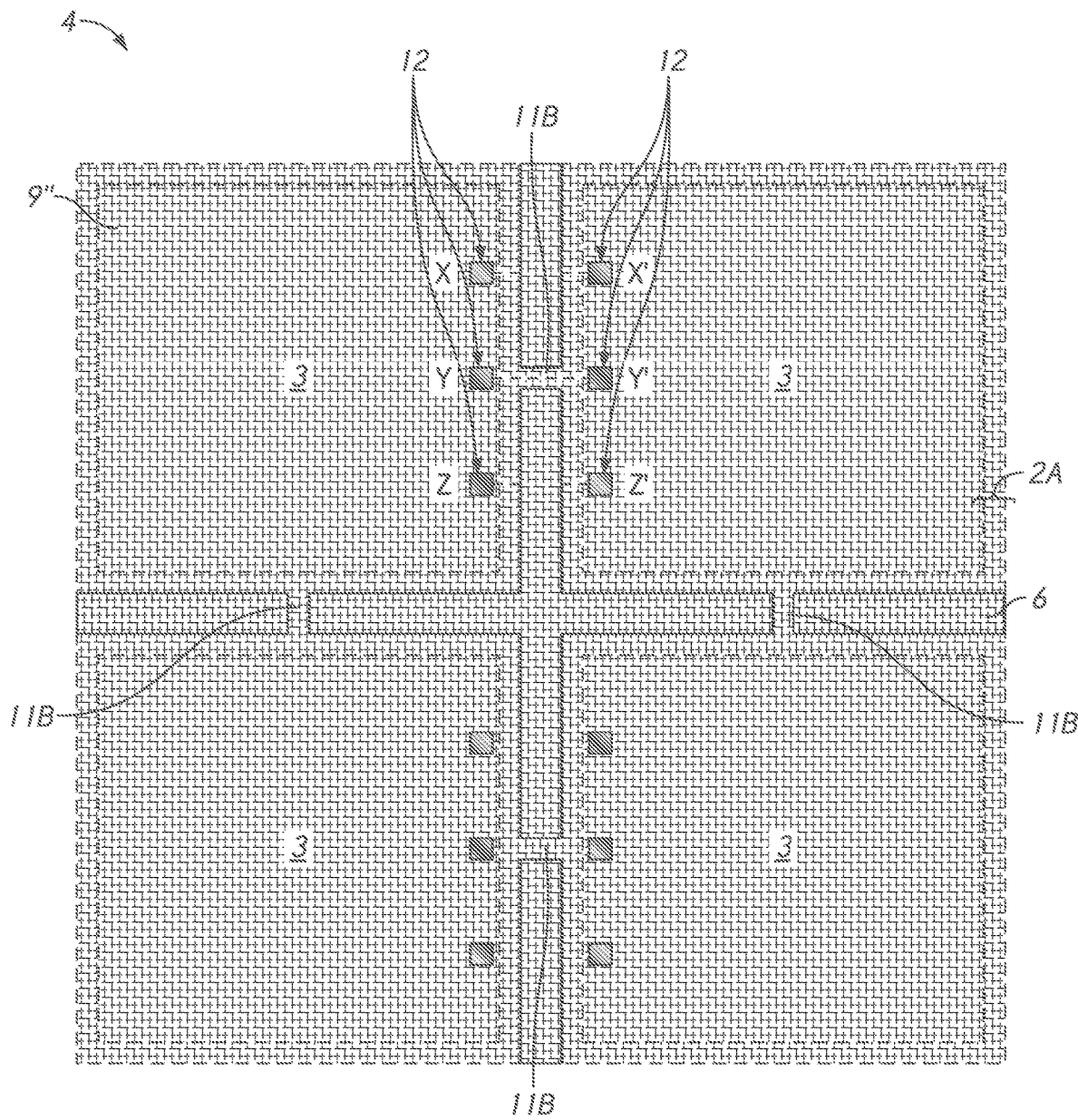
FIG. 10A is a layout diagram of a portion of a semiconductor device in accordance with an embodiment of the present disclosure.
Figure 10B:
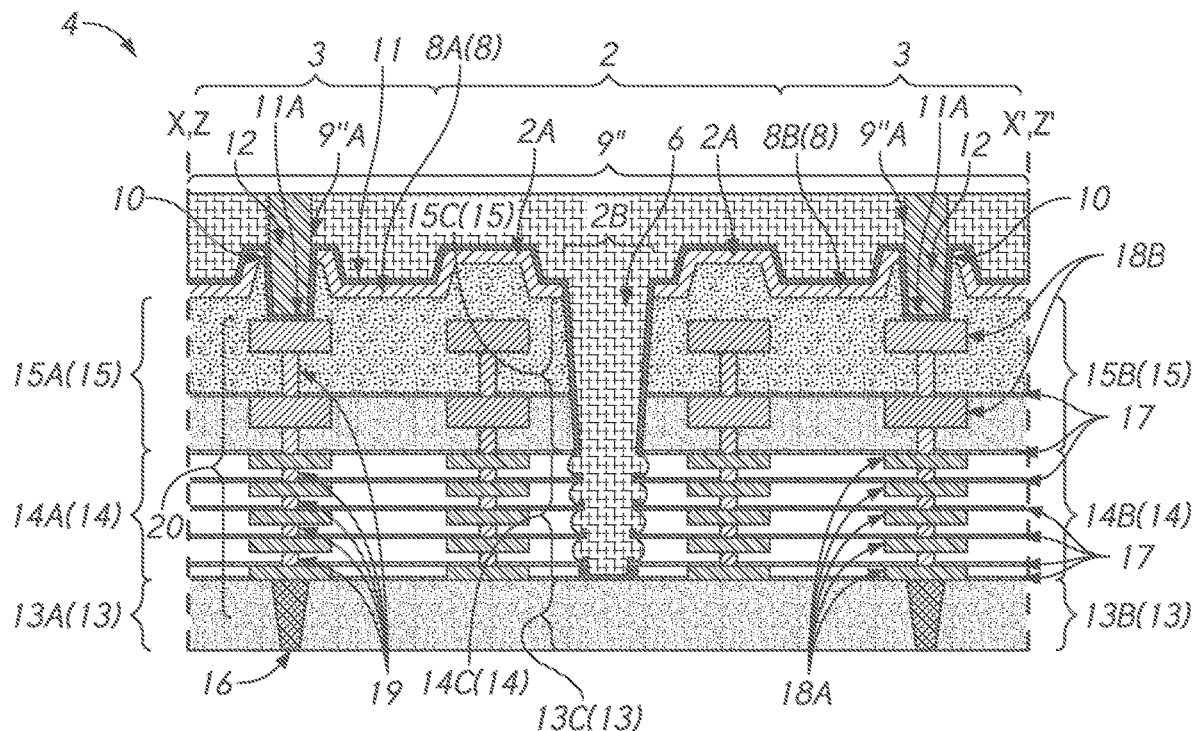
FIGS. 10B and 10C are diagrams illustrating vertical cross-sectional views of one schematic structure of the semiconductor device in accordance with an embodiment of the present disclosure.
Figure 10C:
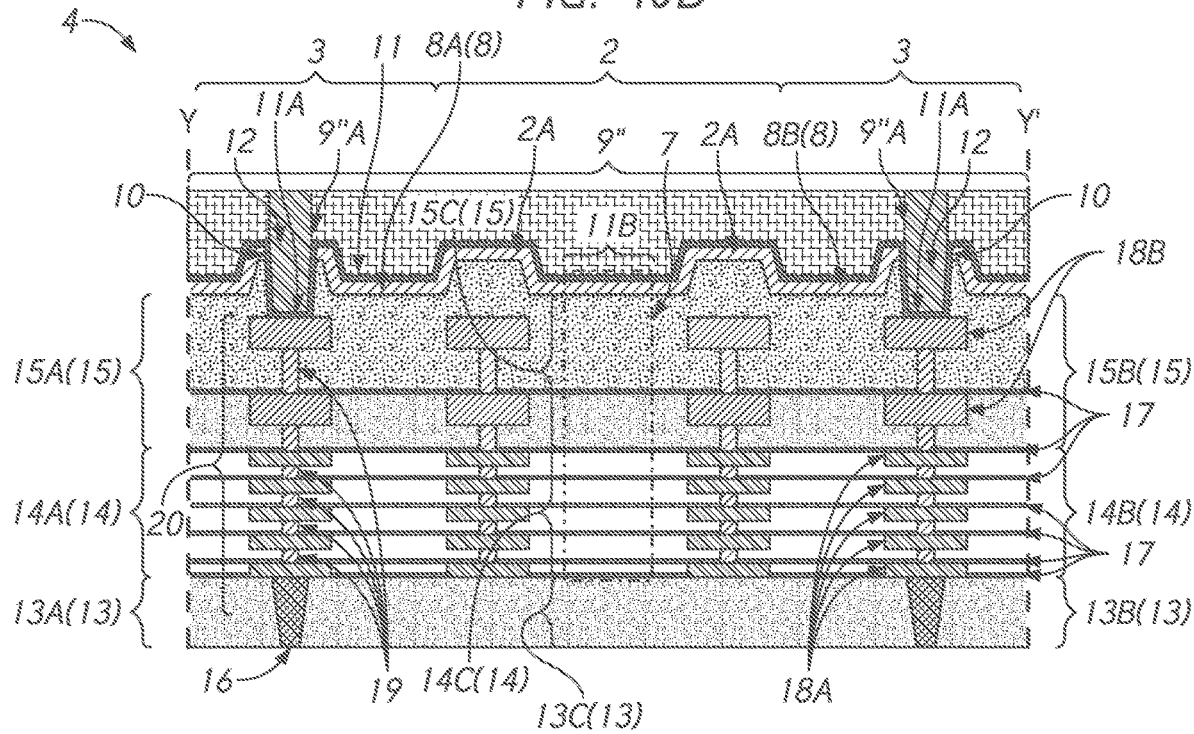

FIG. 10A is a layout diagram of a portion 4 of a semiconductor device 100 in accordance with an embodiment of the present disclosure. FIGS. 10B and 10C are diagrams illustrating vertical cross-sectional views of one schematic structure of the semiconductor device 100 in accordance with an embodiment of the present disclosure. FIG. 10A may be a plan view of the portion 4 of the semiconductor device 100 after forming conductive pillars 12 in FIGS. 2A-2C by electroplating. FIG. 10B may be a cross-sectional view showing the portion 4 of the semiconductor device 100 along on a line X-X' or Z-Z' shown in FIG. 10A. FIG. 10C may be a cross-sectional view showing the portion 4 of the semiconductor device 100 along on a line Y-Y' shown in FIG. 10A.

All the portions 11A of the barrier and conductive seed layer 11 and the rest of the barrier and conductive seed layer 11 are coupled by portions 11B of the barrier and conductive seed layer 11 above the support structure 7. Electroplating may be performed and the conductive pillars 12 may be formed on portions 11A of the barrier and conductive seed layer 11 in the holes 9"A. Because the rest of the barrier and conductive seed layer 11 other than the portions 11A is covered by the photoresist 9", the conductive pillars 12 may be selectively developed on the exposed portions 11A through the holes 9"A. As shown in FIGS. 10B and 10C, the conductive pillars 12 in a cross-section along the line X-X', Y-Y' or Z-Z' of FIG. 10A may be provided above interconnects 20 in the circuit regions 3. After forming the conductive pillars 12 by electroplating, the photoresist 9" may be removed as shown in FIGS. 2A, 2B and 2C together with the rest of the barrier and conductive seed layer 11. The portions 11A of the barrier and conductive seed layer 11 between the wires 18B and the conductive pillars 12 may remain. However, the barrier and conductive seed layer 11 on edge surfaces of the holes 10 may be removed as shown in FIGS. 2B and 2C.

Figure 11A:
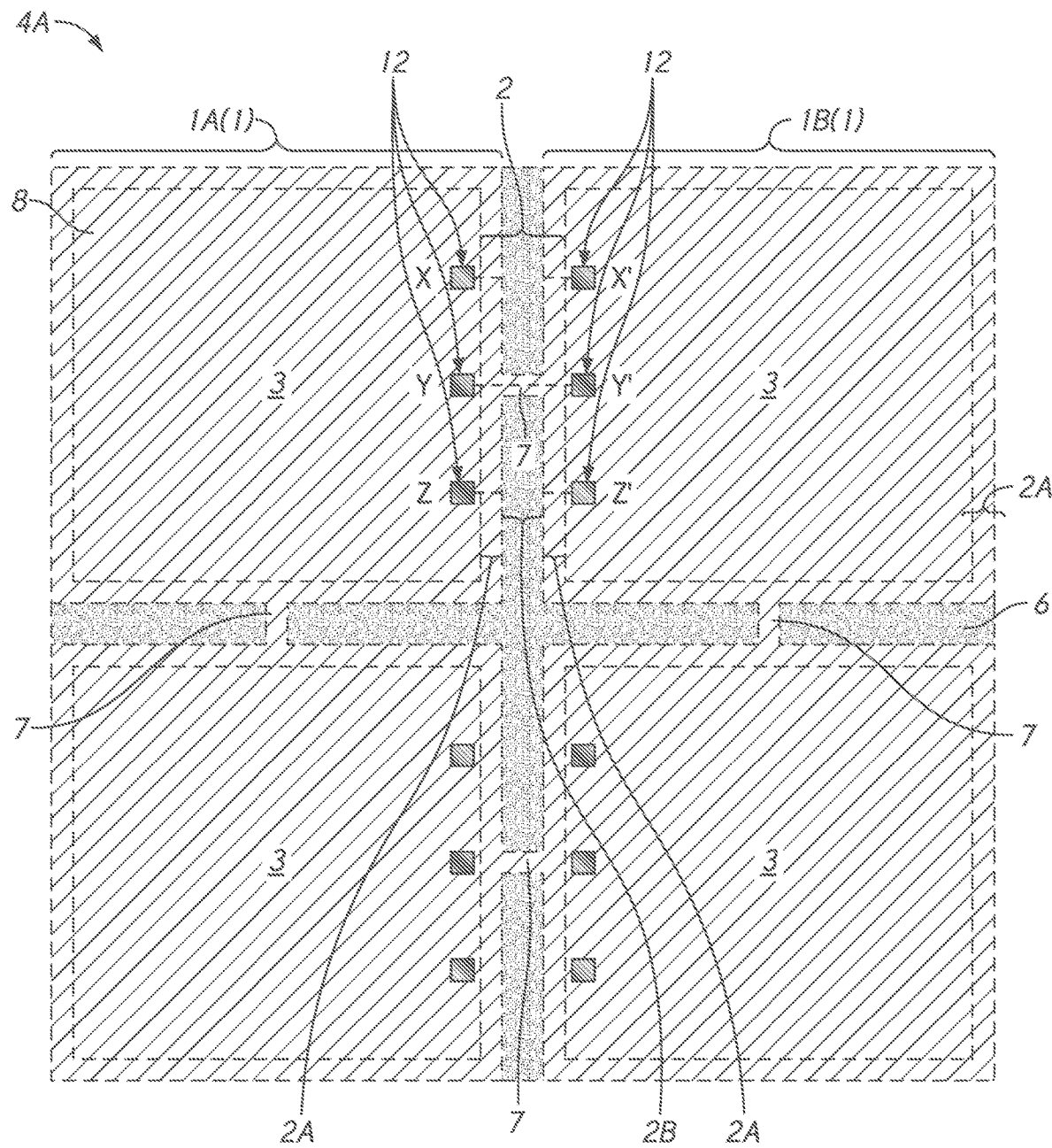
FIG. 11A is a layout diagram of a portion of a semiconductor device in accordance with an embodiment of the present disclosure.
Figure 11B:
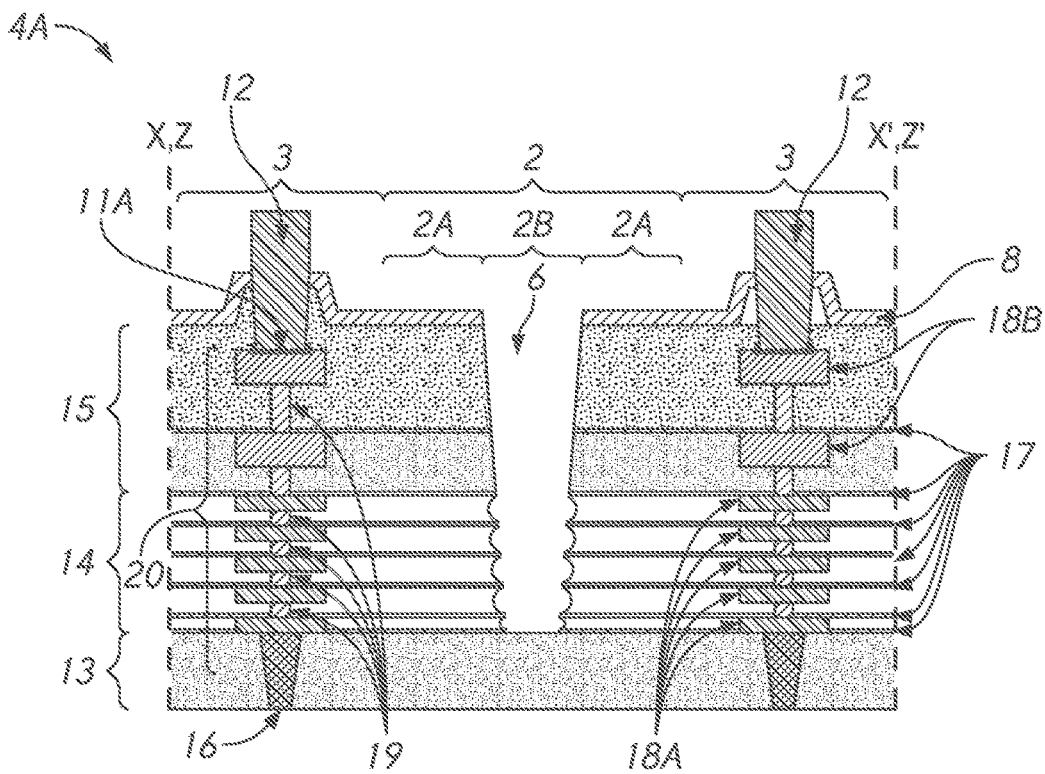
FIGS. 11B and 11C are diagrams illustrating vertical cross-sectional views of one schematic structure of the semiconductor device in accordance with an embodiment of the present disclosure.
Figure 11C:
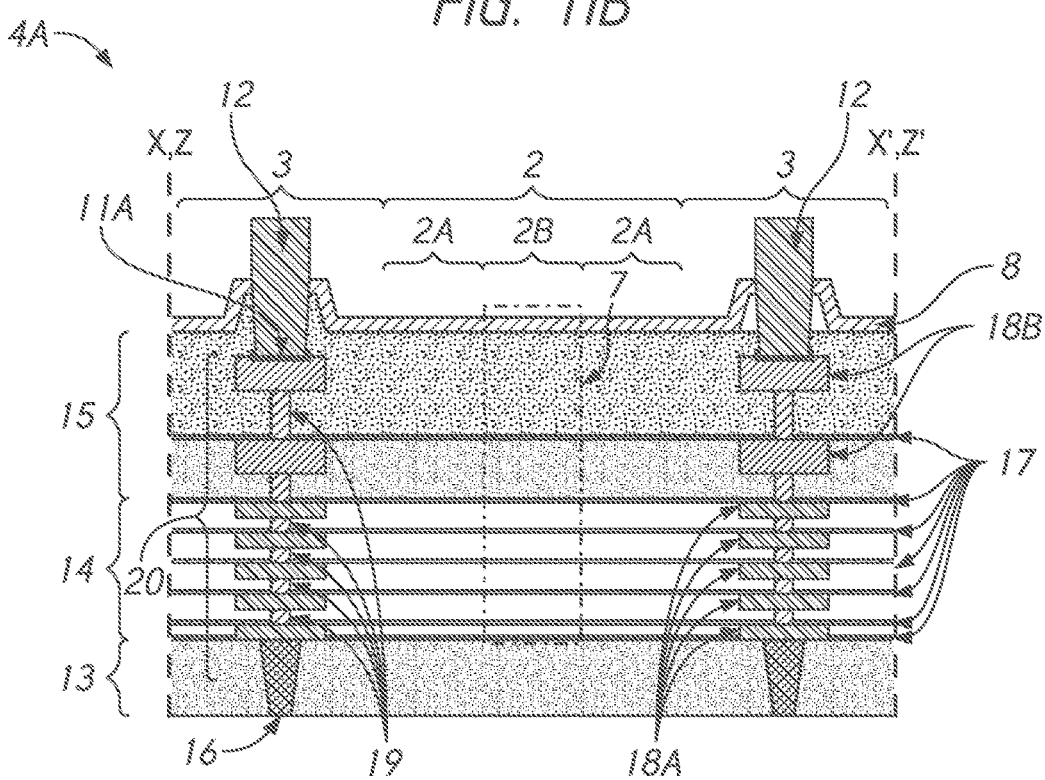

FIG. 11A is a diagram for a layout of a portion 4A of the semiconductor device 100 in FIG. 1A in accordance with another embodiment of the present disclosure. In some embodiments, FIG. 11A may be a plan view of the portion 4A of the semiconductor device 100. FIGS. 11B and 11C are diagrams illustrating vertical cross-sectional views of one schematic structure of the semiconductor device 100 in accordance with an embodiment of the present disclosure. FIG. 11B may be a cross-sectional view showing the portion 4A of the semiconductor device 100 along on a line X-X' or Z-Z' shown in FIG. 11A. FIG. 11C may be a cross-sectional view showing the portion 4A of the semiconductor device 100 along on a line Y-Y' shown in FIG. 11A. In some embodiments, the portion 4A of the semiconductor device 100 may be the portion 4 of the semiconductor device 100 in FIG. 1A. In some embodiments, the portion 4A may be a multilayer structure. A semiconductor substrate 13, dielectric layers 14, 15 and 17 disposed on the semiconductor substrate 13, conductive pillars 12, conductive wires 18A and 18B, interconnects 20 including through electrodes 19 under the conductive pillars 12, grooves 6 and support structures 7 in FIGS. 11A-11C may have similar structures as the semiconductor substrate 13, the dielectric layers 14, 15 and 17 disposed on the semiconductor substrate 13, the conductive pillars 12, the conductive wires 18A and 18B, the interconnects 20 including the through electrodes 19 under the conductive pillars 12, the grooves 6 and the support structures 7 in FIGS. 2A-2C. Thus the description of the structures of the semiconductor substrate 13, the dielectric layers 14, 15 and 17 disposed on the semiconductor substrate 13, the conductive pillars 12, the conductive wires 18A and 18B, the interconnects 20 including the through electrodes 19, the grooves 6 and the support structures 7 in FIGS. 11A-11C is omitted for brevity.

The portion 4A may include semiconductor chips 1 before separation. The semiconductor chips 1 may include circuit regions 3 surrounded by edges 2A. The portion 4A may include a scribe region 2 disposed between the circuit regions 3 of the semiconductor chips 1. The scribe region 2 may include the edges 2A of the semiconductor chips 1 and cut regions 2B between adjacent edges 2A of adjacent semiconductor chips 1. The interconnects 20 may be disposed in the circuit region 3. In some embodiments, there may be neither wires 18A and 18B nor the interconnects 20 disposed in the edges 2A of the semiconductor chips 1. In some embodiments, a portion of the dielectric layer 15 beneath the cover layer 8 including the wire 18B and around the conductive pillar 12 may have a greater thickness than a thickness of the portion of the dielectric layer 15 between the edge 2A and the conductive pillar 12 of the chip 1 in the same cross-section. A portion of the dielectric layer 15 beneath the cover layer 8 in the edges 2A may have the same thickness as the thickness of the portion of the dielectric layer 15 between the edge 2A and the conductive pillar 12 of the chip 1 in the same cross-section.

Figure 12:
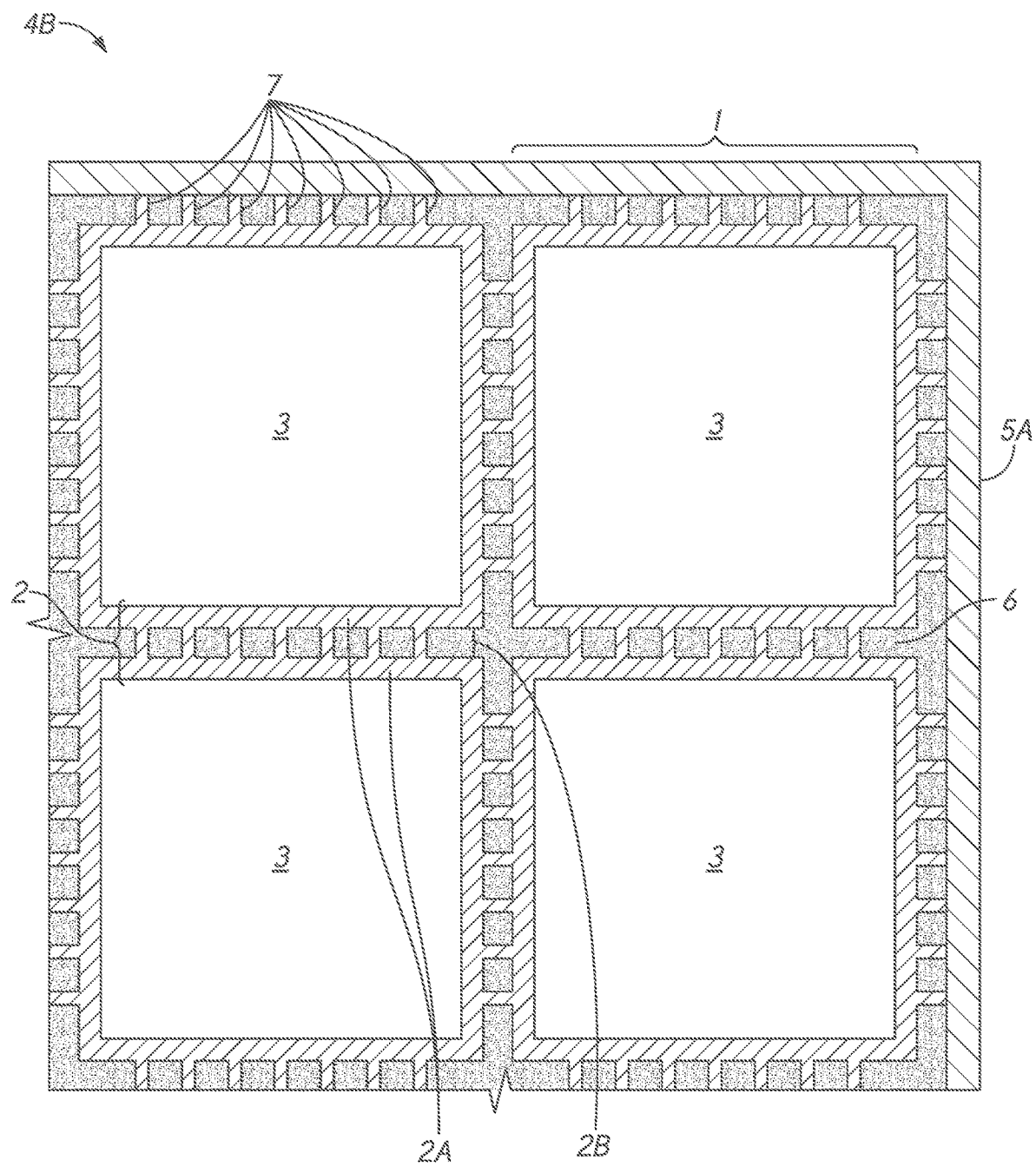
FIG. 12 is a layout diagram of a portion of a semiconductor device in accordance with an embodiment of the present disclosure.

FIG. 12 is a layout diagram of a portion 4B of a semiconductor device 100 in accordance with an embodiment of the present disclosure. In some embodiments, FIG. 12 may be a plan view of the portion 4B of the semiconductor device 100. In some embodiments, the portion 4B of the semiconductor device 100 may be the portion 4 of the semiconductor device 100 in FIG. 1A. In some embodiments, the portion 4B may be a multilayer structure. The portion 4B of the semiconductor device 100 may include a margin area 5A surrounding a portion of edges of the portion 4B of the semiconductor device 100. The portion 4B may include semiconductor chips 1 before separation. Each of the semiconductor chips 1 may include a circuit region 3 surrounded by edges 2A. The portion 4B may include a scribe region 2 disposed between the circuit regions 3 of the semiconductor chips 1. The scribe region 2 may include the edges 2A of the semiconductor chips 1 and cut regions 2B between adjacent edges 2A of adjacent semiconductor chips 1. A portion of the cut regions 2B may be etched to form grooves 6. While each semiconductor chip 1 of FIGS. 1A-1B and 2A-2C included one support structure 7 on each edge 2A on each side of the semiconductor chip 1, the semiconductor chip 1 of FIG. 12 may include a plurality of support structures 7 on each edge 2A on each side of the semiconductor chip 1. A portion of the plurality of support structures 7 may be disposed in the cut region 2B between each edge 2A and an adjacent edge 2A of an adjacent semiconductor chip 1. Another portion of the plurality of support structures 7 may be disposed in the cut region 2B between an edge 2A of a semiconductor chip 1 and an adjacent margin area 5A. Each portion of the support structures 7 on each edge 2A on each side of the semiconductor chip 1 may be disposed at equal intervals.

Figure 13:
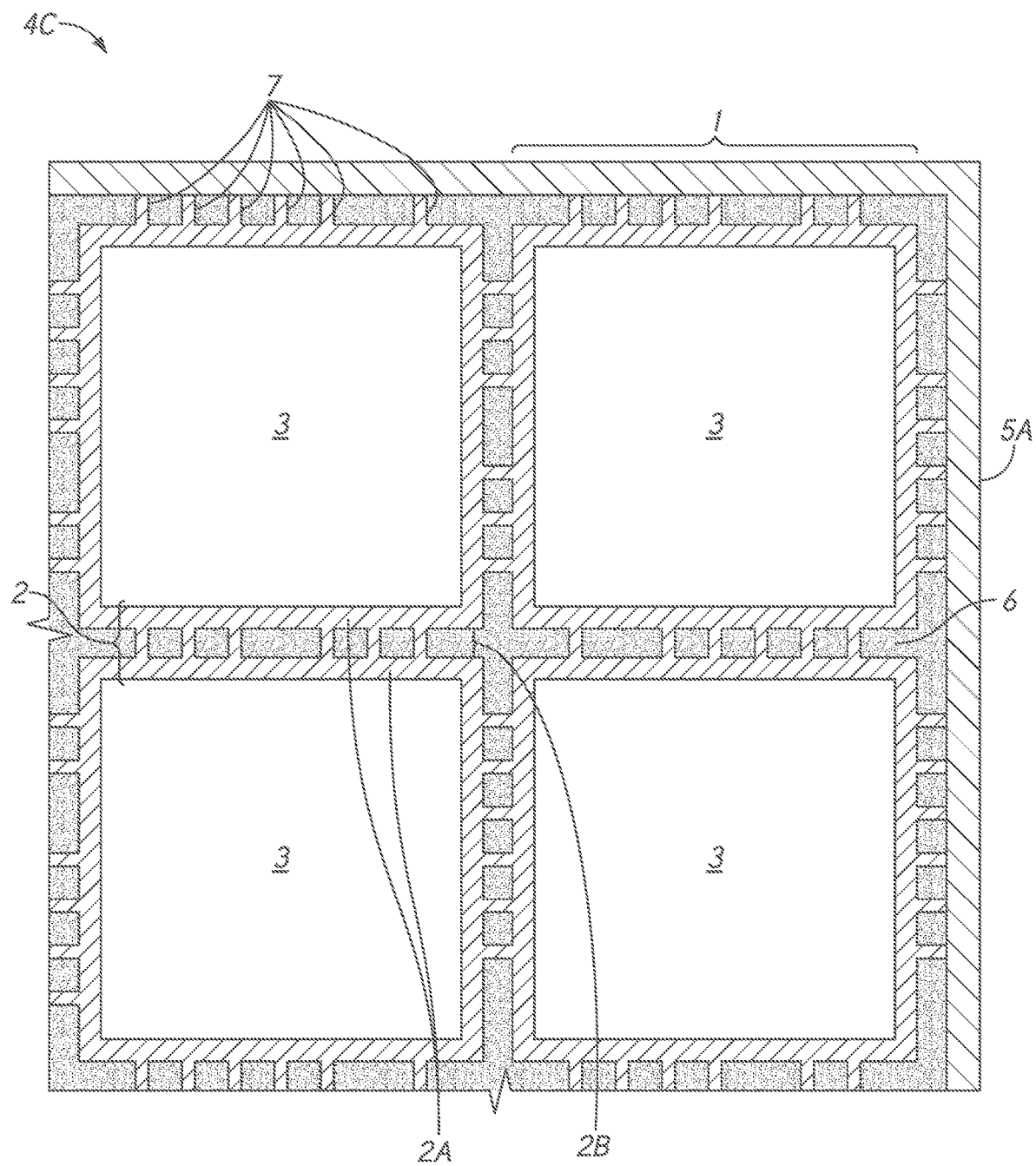
FIG. 13 is a layout diagram of a portion of a semiconductor device in accordance with an embodiment of the present disclosure.

FIG. 13 is a layout diagram of a portion 4C of a semiconductor device 100 in accordance with an embodiment of the present disclosure. In some embodiments, the portion 4C may be a multilayer structure. Similarly to the portion 4B of the semiconductor device 100 in FIG. 12, the portion 4C of the semiconductor device may include semiconductor chips 1 including circuit regions 3 and edges 2A, a scribe region 2 including the edges 2A and a cut region 2B, and a margin area 5A. Each portion of the support structures 7 on each edge 2A on each side of the semiconductor chip 1 in FIG. 13 may be disposed at different intervals. The support structures 7 of opposite edges 2A of the semiconductor chip 1 may disposed in an asymmetrical manner as shown in FIG. 13. Due to locations of test circuits (not shown) in edges 2A, locations of support structures 7 on the edges 2A may be restricted. By using the layout of FIG. 13, ends of the support structures 7 may be disposed away from the test circuits.

The support structures 7 may assist controlling an electric current of electroplating for each mask region (e.g., the mask region 5 of FIG. 1A) covered by each photoresist. In some embodiments, a number of the support structures 7 for each mask region may be equal across mask regions 5 in the semiconductor device 100. In some embodiments, a total area of the support structures 7 of each mask region 5 may be constant across mask regions 5 in the semiconductor device 100. In some embodiments, a scribe region 2 including a margin area 5 may have a width about half of a width of a scribe region 2 between the edges 2A of the adjacent semiconductor devices 1. A pattern of either equal or unequal intervals of the support structures 7 in the scribe region 2 having the half width may be a symmetrical arrangement.

Figure 14A:
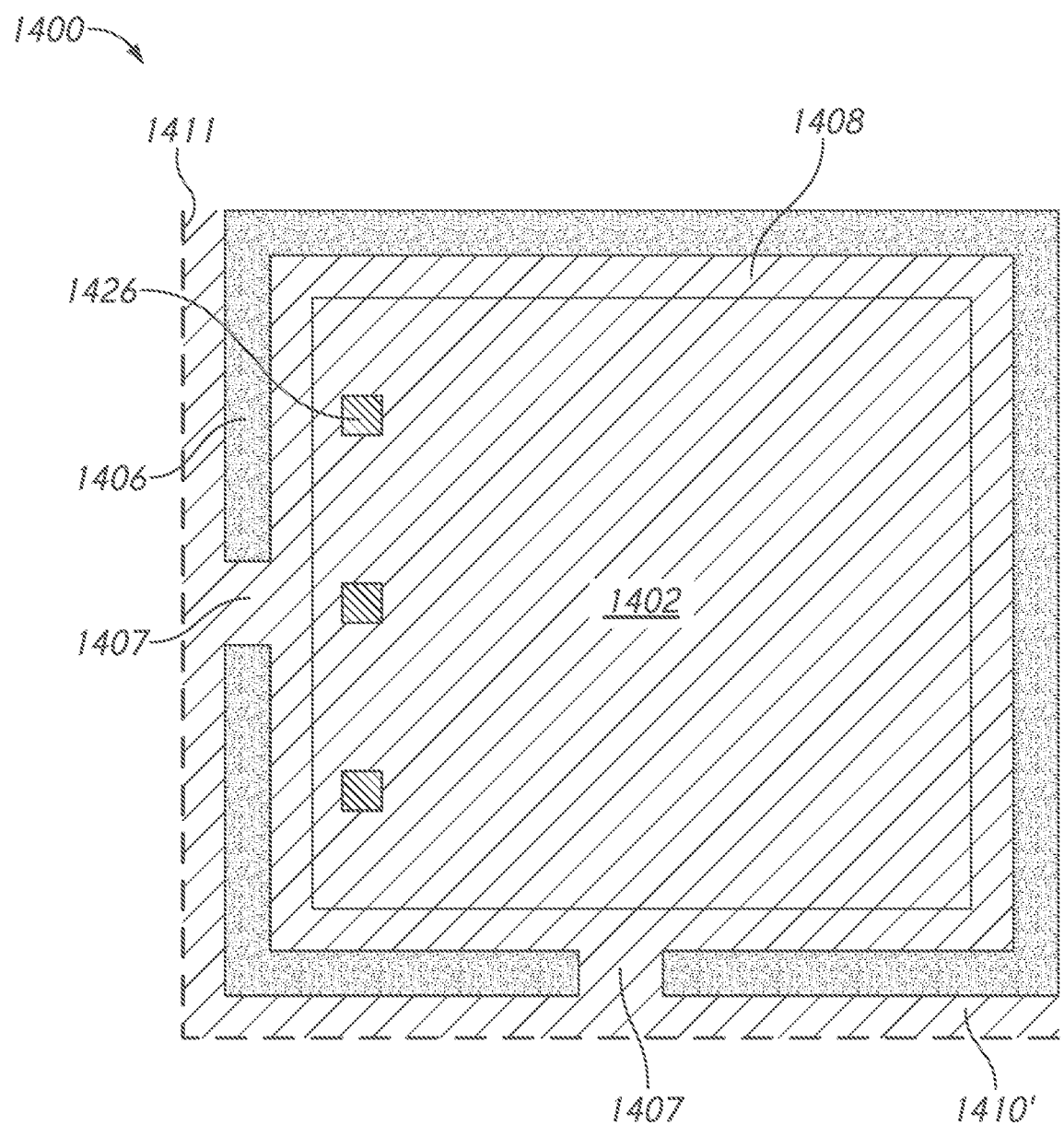
FIG. 14A is a diagram illustrating a top view of a portion of a semiconductor device in accordance with an embodiment of the present disclosure.
Figure 14B:
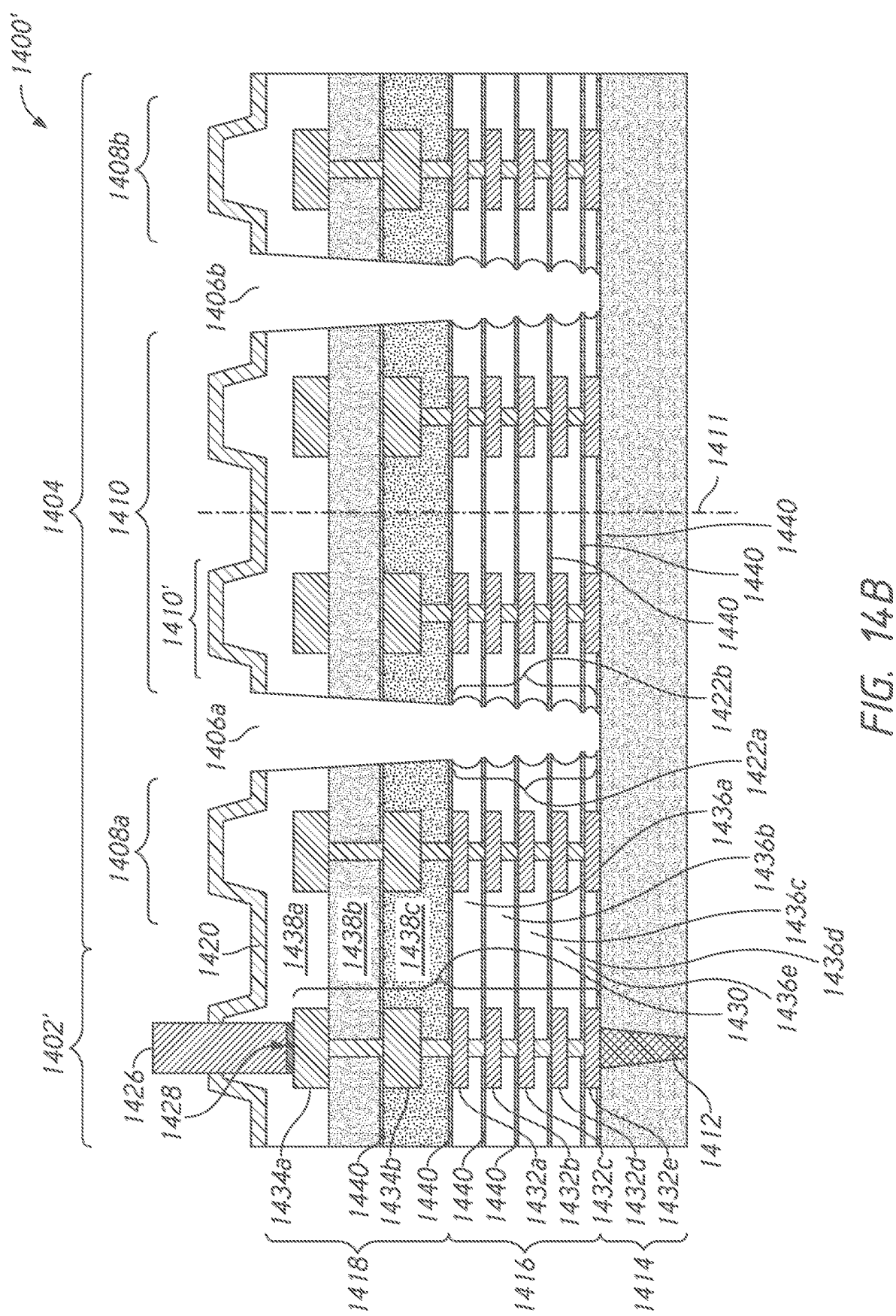
FIGS. 14B and 14C are diagrams illustrating vertical cross-sectional views of one schematic structure of a semiconductor device in accordance with an embodiment of the present disclosure.
Figure 14C:
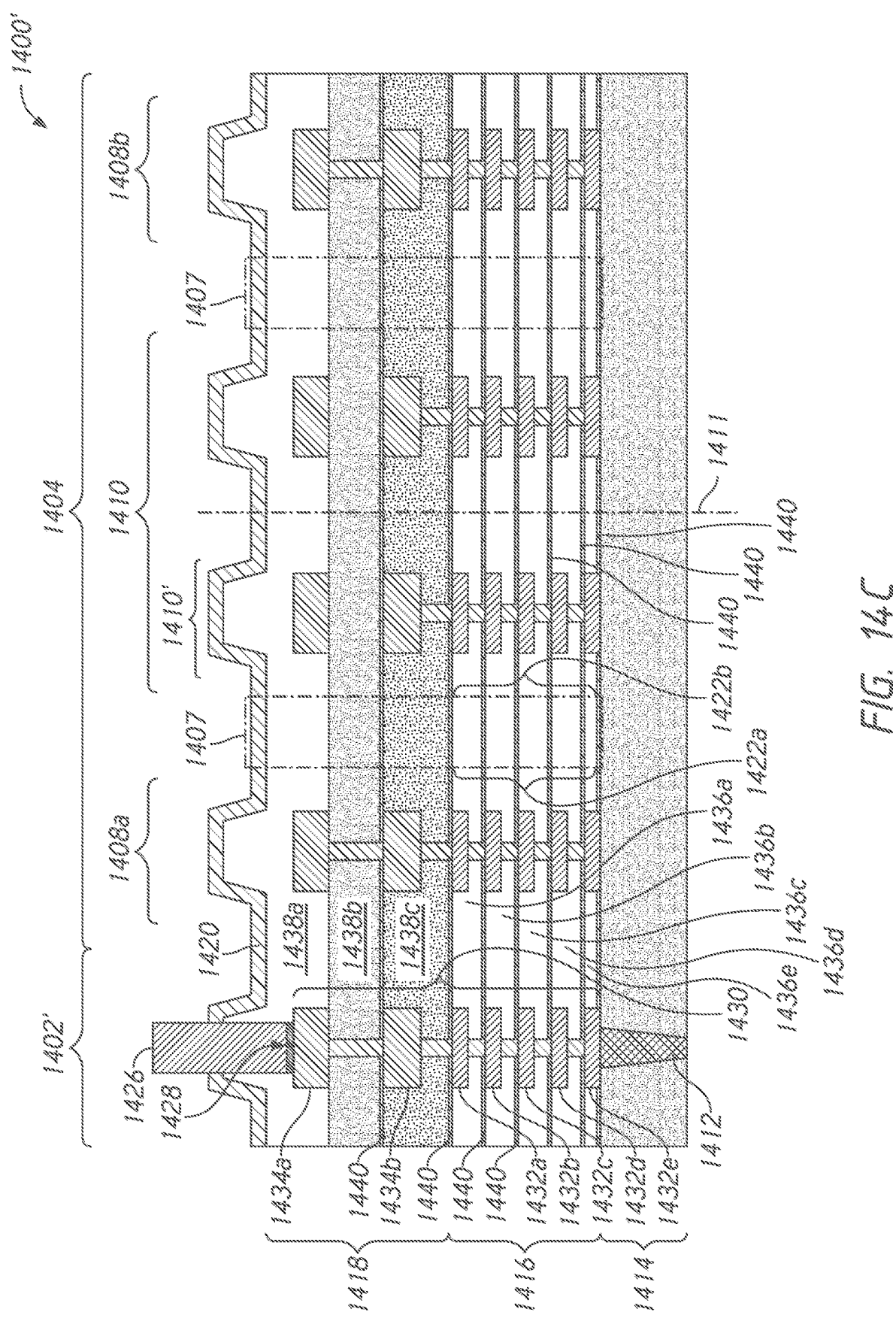

FIG. 14A is a diagram illustrating a top view of a portion 1400 of a semiconductor device 100 in accordance with an embodiment of the present disclosure. FIGS. 14B and 14C are diagrams illustrating vertical cross-sectional views of one schematic structure of a semiconductor device 1400' in accordance with an embodiment of the present disclosure. In some embodiments, the portion 1400 may be a semiconductor chip. The portion 1400' may include portions of semiconductor chips 1400 before separation. In some embodiments, the portions 1400 and 1400' of the semiconductor device 100 may be a multilayer structure. The multilayer structure 1400 shown in FIGS. 14A-14C may be similar to the structure previously described with reference to and shown in FIGS. 2A-2C. For example, a semiconductor substrate 1414, dielectric layers 1416 and 1418, a cover layer 1420, a circuit region 1402 in FIGS. 14A-14C have similar structures as the semiconductor substrate 13, the dielectric layers 14 and 15 and the cover layer 8 and a circuit region 3 in FIGS. 2A-2C. Thus the description of the structures of the semiconductor substrate 1414, the dielectric layers 1416 and 1418, the cover layer 1420 and the circuit region 1402 is omitted for brevity.

The portion 1400' of the semiconductor device 100 may have a scribe region 1404. The scribe region disposed between the circuit regions 1402 of the semiconductor chips 1400. The portion 1400' of the semiconductor device 100 may also include a sub region 1402' of the circuit region 1402. The scribe region 2 may include the edges 1408a and 1408b of the adjacent semiconductor chips 1400 facing each other across a scribe center region 1410. In some embodiments, a scribe center region 1410 may include a dicing line 1411. After the dicing at the dicing line 1411, a portion 1410' of the scribe center region 1410 may remain with the chip 1400, including the circuit region 1402' and the edge 1408, as shown in FIG. 14A. The portion 1400' of the semiconductor device 100 may include grooves 1406a and 1406b in the scribe region 1404, as shown in FIG. 14B. In some embodiments, the groove 1406a may be formed by etching an area between the edge 1408a and a portion of the scribe center region 1410'. Edge surfaces of the dielectric layers 1416 facing the groove 1406a or 1406b may have roughness. The edge surfaces of the dielectric layers 1416 may include concave portions along cut cross sections of the dielectric layers 1416 facing the groove 1406a or 1406b, for example. In another example, the edge surfaces of the dielectric layers 1416 may be uneven.

The portion 1400' of the semiconductor device 100 may also include support structures 1407 between the edges 1408a and/or 1408b and the scribe center region 1410 as shown in FIG. 14C. Each support structure 1407 may have one end on one edge, either 1408a or 1408b of the adjacent edges 1408a and 1408b and another end on the scribe center region 1410. Thus, support structures 1407 and the scribe center region 1410 may physically connect adjacent semiconductor chips 1400 before dicing. As shown in FIG. 14A, each support structure 1407 may have a side facing the groove 1406 (e.g., the grooves 1406a or 1406b in FIG. 14B). In some embodiments, some support structure 1407 may be between grooves, either the grooves 1406 as shown in FIG. 14A. In some embodiments, the support structure 1407 may include a portion of the dielectric layers 1416, a portion of the dielectric layers 1418 and a portion of the dielectric layer 1440 on the substrate 1414 as shown in FIG. 14C. The support structure 1407 may also include a portion of the cover layer 1420 on the portion 1418 of the dielectric layers 15. The support structure 1407 may be continuous with the edge 1408a and the portion of the scribe center region 1410' of the chip 1400. In some embodiments, the support structure 1407 may be formed by being unremoved after etching the grooves 1406a and 1406b.

Type of devices, materials and methods used in the embodiments described the above are merely examples. However, in other embodiments, combinations of the types of devices, materials and methods other than those specifically described in the present disclosure may be used without departing from the scope of the present disclosure. For example, instead of using a photoresist that covers a portion of a semiconductor device formed on a wafer, a hardmask may be used to cover an entire semiconductor device.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus, comprising:
a multilayer structure including:
a first circuit region;
a first edge surrounding the first circuit region;
a second circuit region;
a second edge surrounding the second circuit region and facing the first edge;
a substrate across the first circuit region and the second circuit region;
a plurality of dielectric layers above the substrate across the first circuit region and the second circuit region, the plurality of dielectric layers comprising:
a groove at least in part between the first edge and the second edge; and
a support structure between the first edge and the second edge, the support structure having a side facing the groove;
a cover layer on the plurality of dielectric layers; and
a conductive seed layer including a first portion on the support structure and a second portion on the cover layer, the first and second portions coupled to each other.

2. The apparatus of claim 1, further comprising:
a wire in at least one dielectric layer of the plurality of the dielectric layers in the first and second circuit regions; and
a conductive pillar in a hole in the at least one dielectric layer, wherein
the conductive seed layer includes a third portion on the wire, and
the conductive pillar is disposed on the third portion of the conductive seed layer.

3. The apparatus of claim 2, further comprising an interconnect coupled to the wire, the interconnect being disposed in the first circuit region through a first dielectric layer and a second dielectric layer of the plurality of dielectric layers.

4. The apparatus of claim 3, further comprising a through electrode in the substrate, the through electrode coupled to the interconnect.

5. The apparatus of claim 1, further comprising a plurality of support structures,
wherein each support structure has one end on the first edge and another end on the second edge.

6. The apparatus of claim 5, wherein the plurality of support structures are disposed at equal intervals.

7. The apparatus of claim 5, further comprising a circuit disposed on a portion of the first edge, and
wherein the one ends of the plurality of support structures are disposed away from the portion of the first edge.

8. The apparatus of claim 5, further comprising:
a plurality of mask regions; and
a margin area surrounding the plurality of mask regions;
wherein a total area of the plurality of the support structures of each mask region is constant across the plurality of mask regions.

9. The apparatus of claim 5, further comprising:
a plurality of mask regions; and
a margin area surrounding the plurality of mask regions;
wherein a number of the plurality of the support structures of each mask region is equal across the plurality of mask regions.

10. An apparatus comprising:
a substrate;
a first dielectric layer above the substrate;
a second dielectric layer above the first dielectric layer;
a cover layer on the second dielectric layer;
a chip including:
a portion of the substrate;
a first portion of the first dielectric layer;
a first portion of the second dielectric layer;
a first portion of the cover layer;
an edge;
a residual support structure protruding from the edge and connected to the edge, the residual supporting structure including:
a second portion of the first dielectric layer continuous with the first portion of the first dielectric layer;
a second portion of the second dielectric layer continuous with the first portion of the second dielectric layer; and
a second portion of the cover layer continuous with the first portion of the cover layer; and
a conductive seed layer including a first portion on the residual support structure and a second portion on the cover layer, the first and second portions of the conductive seed layer coupled to each other.

11. The apparatus of claim 10, wherein
the first portion of the second dielectric layer comprises a wire,
the conductive seed layer includes a third portion on the wire,
the apparatus further comprises a conductive pillar in a hole in the first portion of the second dielectric layer, the conductive pillar disposed on the third portion of the conductive seed layer.

12. The apparatus of claim 11, wherein the conductive pillar includes at least one of copper or at least one of nickel.

13. The apparatus of claim 11, wherein the first dielectric layer includes a material that has a dielectric constant lower than a dielectric constant of a material included in the second dielectric layer.

14. The apparatus of claim 13, wherein the first dielectric layer includes at least one of silicon oxycarbide or at least one of silicon carbonitride.

15. The apparatus of claim 13, wherein the second dielectric layer includes silicon dioxide.

16. The apparatus of claim 13, wherein the first portion of the second dielectric layer has a third portion in the edge having a thickness greater than a thickness of a fourth portion between the edge and the conductive pillar.

* * * * *